(12) United States Patent
Wu et al.

(10) Patent No.: US 12,057,372 B2
(45) Date of Patent: Aug. 6, 2024

(54) METHODS FOR FORMING CONTACT STRUCTURES AND SEMICONDUCTOR DEVICES INCLUDING FORMING A SPACER STRUCTURE INTO A BASE STRUCTURE

(71) Applicant: YANGTZE MEMORY TECHNOLOGIES CO., LTD., Wuhan (CN)

(72) Inventors: Linchun Wu, Wuhan (CN); Kun Zhang, Wuhan (CN); Zhong Zhang, Wuhan (CN); Wenxi Zhou, Wuhan (CN); Zhiliang Xia, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 0 days.

(21) Appl. No.: 17/549,557

(22) Filed: Dec. 13, 2021

(65) Prior Publication Data

US 2022/0102247 A1    Mar. 31, 2022

Related U.S. Application Data

(60) Division of application No. 17/020,473, filed on Sep. 14, 2020, now Pat. No. 11,562,945, which is a (Continued)

(51) Int. Cl.
*H01L 21/48* (2006.01)
*H01L 23/48* (2006.01)
(Continued)

(52) U.S. Cl.
CPC ........ *H01L 23/481* (2013.01); *H01L 21/4814* (2013.01); *H10B 43/10* (2023.02);
(Continued)

(58) Field of Classification Search
CPC ......... H01L 27/11563; H01L 27/11573; H01L 23/481; H01L 21/76898; H10B 43/10;
(Continued)

(56) References Cited

U.S. PATENT DOCUMENTS 9,583,500 B2   2/2017  Pachamuthu et al.
9,824,966 B1   11/2017 Kanakamedala et al.
(Continued)

FOREIGN PATENT DOCUMENTS

CN    107068684 A    8/2017
CN    107996000 A    5/2018
(Continued)

OTHER PUBLICATIONS

International Search Report issued in corresponding International Application No. PCT/CN2020/106068, dated Apr. 25, 201, 5 pages.
(Continued)

*Primary Examiner* — Khiem D Nguyen
(74) *Attorney, Agent, or Firm* — BAYES PLLC

(57) ABSTRACT

Embodiments of methods for forming contact structures and semiconductor devices thereof are disclosed. In an example, a method for forming a semiconductor device includes forming a spacer structure from a first surface of the base structure into the base structure, forming a first contact portion surrounded by the spacer structure, and forming a second contact portion in contact with the first contact portion. The second contact extends from a second surface of the base structure into the base structure.

17 Claims, 10 Drawing Sheets

Related U.S. Application Data continuation of application No. PCT/CN2020/106068, filed on Jul. 31, 2020.

(51) Int. Cl.
*H10B 43/10* (2023.01)
*H10B 43/27* (2023.01)
*H10B 43/35* (2023.01)
*H10B 43/40* (2023.01)

(52) U.S. Cl.
CPC ............. *H10B 43/27* (2023.02); *H10B 43/35* (2023.02); *H10B 43/40* (2023.02)

(58) Field of Classification Search
CPC ........ H10B 43/27; H10B 43/35; H10B 43/40; H10B 43/50; H10B 43/30
USPC ........................................................ 257/324
See application file for complete search history.

(56) References Cited

U.S. PATENT DOCUMENTS

| | | | |
|---|---|---|---|
| 9,853,045 B2* | 12/2017 | Hwang | ................... H10B 43/27 |
| 9,887,208 B2* | 2/2018 | Son | ................... H10B 43/40 |
| 10,283,493 B1 | 5/2019 | Nishida | |
| 10,354,980 B1 | 7/2019 | Mushiga et al. | |
| 10,354,987 B1* | 7/2019 | Mushiga | ............. H01L 27/0688 |
| 10,381,322 B1 | 8/2019 | Azuma et al. | |
| 10,381,362 B1 | 8/2019 | Cui et al. | |
| 11,004,773 B2 | 5/2021 | Wu et al. | |
| 11,101,325 B2 | 8/2021 | Kiyotoshi et al. | |
| 11,342,244 B2 | 5/2022 | Kim et al. | |
| 11,562,945 B2 | 1/2023 | Wu et al. | |
| 2010/0207195 A1* | 8/2010 | Fukuzumi | .............. H10B 43/27 |
| | | | 257/326 |
| 2012/0056330 A1 | 3/2012 | Lee et al. | |
| 2014/0015032 A1* | 1/2014 | Kim | ....................... H10B 43/27 |
| | | | 257/314 |
| 2014/0167131 A1 | 6/2014 | Lu et al. | |
| 2015/0206587 A1 | 7/2015 | Hasegawa et al. | |
| 2015/0348984 A1* | 12/2015 | Yada | ....................... H10B 41/35 |
| | | | 257/326 |
| 2015/0380418 A1 | 12/2015 | Zhang et al. | |
| 2016/0111439 A1* | 4/2016 | Tsutsumi | .......... H01L 27/11556 |
| | | | 438/257 |
| 2016/0204122 A1* | 7/2016 | Shoji | ................. H01L 27/11575 |
| | | | 257/314 |
| 2017/0025433 A1* | 1/2017 | Lee | ........................ H10B 43/10 |
| 2018/0122904 A1* | 5/2018 | Matsumoto | ....... H01L 27/11573 |
| 2018/0190668 A1* | 7/2018 | Kim | ....................... H10B 41/30 |
| 2018/0247953 A1* | 8/2018 | Lee | ........................ H10B 43/40 |
| 2018/0366487 A1 | 12/2018 | Okizumi et al. | |
| 2019/0067308 A1 | 2/2019 | Yun et al. | |
| 2019/0088589 A1 | 3/2019 | Zhu et al. | |
| 2019/0157287 A1* | 5/2019 | Huo | ................. H01L 27/11524 |
| 2019/0157294 A1 | 5/2019 | Kanamori et al. | |
| 2019/0252403 A1 | 8/2019 | Kaminaga et al. | |
| 2019/0280002 A1 | 9/2019 | Kai et al. | |
| 2019/0319038 A1 | 10/2019 | Zhang | |
| 2019/0326307 A1 | 10/2019 | Mushiga et al. | |
| 2019/0333581 A1 | 10/2019 | Diep et al. | |
| 2020/0098771 A1 | 3/2020 | Nishikawa et al. | |
| 2020/0203329 A1 | 6/2020 | Kanamori et al. | |
| 2020/0235090 A1 | 7/2020 | Chowdhury et al. | |
| 2020/0243498 A1* | 7/2020 | Zhang | ................ G11C 16/0483 |
| 2020/0312863 A1 | 10/2020 | Iwai et al. | |
| 2020/0312867 A1* | 10/2020 | Xiao | ..................... H10B 43/27 |
| 2020/0373355 A1 | 11/2020 | Lien et al. | |
| 2021/0091103 A1 | 3/2021 | Zhu et al. | |
| 2021/0320094 A1 | 10/2021 | Zhang et al. | |
| 2021/0320121 A1 | 10/2021 | Wu et al. | |

FOREIGN PATENT DOCUMENTS

| | | |
|---|---|---|
| CN | 208589444 U | 3/2019 |
| CN | 110121778 A | 8/2019 |
| CN | 110494979 A | 11/2019 |
| CN | 110574162 A | 12/2019 |
| CN | 110692138 A | 1/2020 |
| CN | 111146202 A | 5/2020 |
| CN | 111384062 A | 7/2020 |
| JP | 2017504217 A | 2/2017 |
| KR | 20180107316 A | 10/2018 |
| TW | 201939716 A | 10/2019 |
| TW | 201939724 A | 10/2019 |
| WO | 2019182657 A1 | 9/2019 |
| WO | 2020149937 A1 | 7/2020 |

OTHER PUBLICATIONS

Extended European Search Report issued in corresponding European Application No. 20 94 7119, dated Oct. 17, 2023, 8 pages.
Communication pursuant to Article 94(3) EPC issued in corresponding European Application No. 20 947 119.2, mailed on May 2, 2024, 5 pages.

* cited by examiner

100

METHODS FOR FORMING CONTACT STRUCTURES AND SEMICONDUCTOR DEVICES INCLUDING FORMING A SPACER STRUCTURE INTO A BASE STRUCTURE

CROSS-REFERENCE TO RELATED APPLICATIONS

This application is a divisional of U.S. application Ser. No. 17/020,473, filed on Sep. 14, 2020, issued as U.S. Pat. No. 11,562,945, entitled "METHODS FOR FORMING CONTACT STRUCTURES AND SEMICONDUCTOR DEVICES THEREOF," which is a continuation of International Application No. PCT/CN2020/106068, filed on Jul. 31, 2020, entitled "METHODS FOR FORMING CONTACT STRUCTURES AND SEMICONDUCTOR DEVICES THEREOF," both of which are incorporated herein by reference in their entireties.

BACKGROUND

Embodiments of the present disclosure relate to methods for forming contact structures and semiconductor devices thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of methods for forming contact structures and semiconductor devices thereof are disclosed herein.

In one example, a semiconductor device includes an insulating layer, a conductive layer over the insulating layer, and a spacer structure in the conductive layer and in contact with the insulating layer. The semiconductor device also includes a first contact structure in the spacer structure and extending vertically through the insulating layer. The first contact structure includes a first contact portion and a second contact portion in contact with each other. An upper surface of the second contact portion is coplanar with an upper surface of the conductive layer.

In another example, a semiconductor device includes an insulating layer, a conductive layer over the insulating layer, and a spacer structure in the conductive layer and in contact with the insulating layer. The semiconductor device also includes a first contact structure in the spacer structure and extending vertically through the insulating layer. The first contact structure includes a first contact portion and a second contact portion in contact with each other. The contact structure also includes a lower surface of the first contact portion is in contact with an upper surface of the second contact portion at a contact interface that is below an upper surface of the conductive layer.

In still another example, a method for forming a semiconductor device includes forming a spacer structure from a first surface of the base structure into the base structure, forming a first contact portion surrounded by the spacer structure, and forming a second contact portion in contact with the first contact portion. The second contact extends from a second surface of the base structure into the base structure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
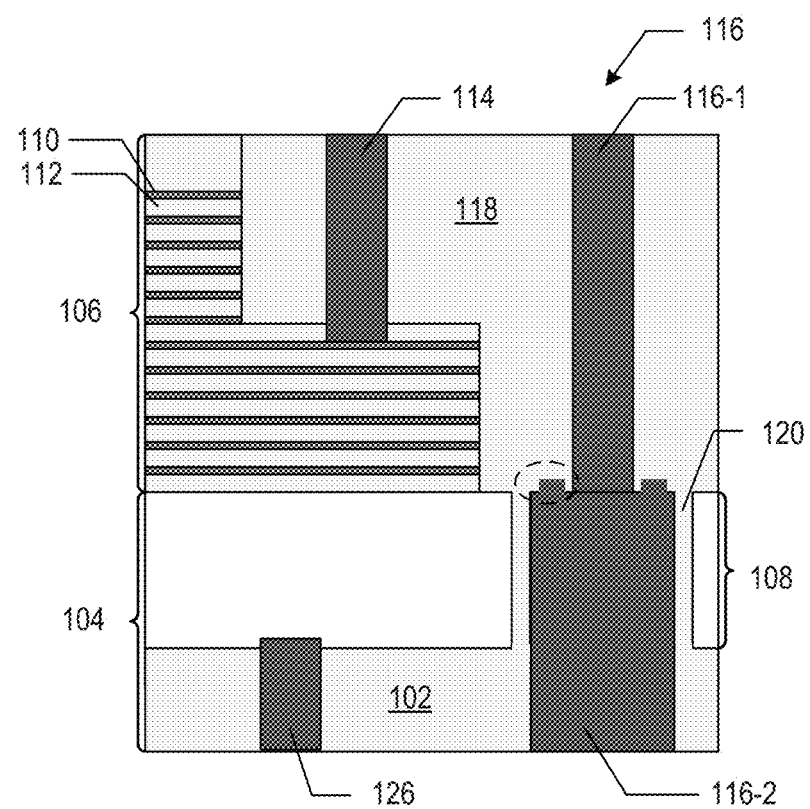
FIG. 1 illustrates a cross-sectional view of an existing contact structure in a semiconductor device.
Figure 1:

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, an upper surface and a lower surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (VIA) contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. A "step" or "stair" refers to a vertical shift in the height of a set of adjoined surfaces. In the present disclosure, the term "stair" and the term "step" refer to one level of a staircase structure and are used interchangeably. In the present disclosure, a horizontal direction can refer to a direction (e.g., the x-direction or the y-direction) parallel with the top surface of the substrate (e.g., the substrate that provides the fabrication platform for formation of structures over it), and a vertical direction can refer to a direction (e.g., the z-direction) perpendicular to the top surface of the structure.

As used herein, the term "3D NAND memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D NAND memory devices, semiconductor plugs are selectively grown to surround the sidewalls of channel structures, e.g., known as sidewall selective epitaxial growth (SEG). Compared with another type of semiconductor plugs that are formed at the lower end of the channel structures, e.g., bottom SEG, the formation of sidewall SEG avoids the etching of the memory film and semiconductor channel at the lower surface of channel holes (also known as "SONO" punch), thereby increasing the process window, in particular when fabricating 3D NAND memory devices with advanced technologies, such as having 96 or more levels with a multi-deck architecture. Moreover, the sidewall SEG structure can be combined with backside processes to form source contacts from the backside of the substrate to avoid leakage current and parasitic capacitance between front side source contacts and word lines and increase the effective device area.

Peripheral contacts, such as through-silicon contacts (TSVs), formed in the peripheral region and facilitating electrical contact between memory cells and peripheral circuits, can also be formed using backside processes in these 3D NAND memory devices. However, the fabrication of peripheral contacts faces challenges because of increasing levels of the 3D NAND memory devices. For example, the formation of peripheral contacts using backside processes often includes a two-step etch processes, e.g., a first etch process to form a first opening for a first contact portion above the substrate, and a second etch process to form a second opening from the backside for a second contact portion. A dielectric spacer is often deposited in the second opening before a conductive material is deposited to fill the second opening and forms the second contact portion. The two-step etching and the deposition processes can be undesirably lengthy and complex.

FIG. 1 illustrates a cross-sectional view of an existing contact structure in a semiconductor device 100. Semiconductor device 100 includes a base structure 104, an insulating structure 118 on base structure 1104, and a memory stack 106 on base structure 104 and in insulating structure 118. Base structure 104 includes an insulating layer 102 and a polysilicon layer 108 over insulating layer 102. Memory stack 106 has a staircase structure of a plurality of stairs and includes a plurality of interleaved conductor layers 110 and dielectric layers 112. Semiconductor device 100 also includes a plurality of channel structures (not shown in FIG. 1) that extend into and are electrically connected to polysilicon layer 108. Intersections of the channel structures and conductor layers 110 form a plurality of memory cells. Semiconductor device 100 also includes a source contact 126 extending in insulating layer 102 and polysilicon layer 108. Source contact 126 is in contact with polysilicon layer 108 and is electrically connected to the channel structures for applying a source voltage. Semiconductor device 100 also includes a word line contact 114 extending in insulating structure 118 and in contact with conductor layer 110 of a respective stair.

Semiconductor device 100 also includes a spacer 120 in polysilicon layer 108 and a peripheral contact 116 extending in insulating structure 118, spacer 120, and insulating layer 102. Peripheral contact 116 includes a first contact portion 116-1 extending in insulating structure 118 and a second contact portion 116-2 extending in base structure 104. First and second contact portions 116-1 and 116-2 are jointly connected to each other apart from memory stack 106. Second contact portion 116-2 and source contact 126 are formed by backside processes. Spacer 120 insulates second contact portion 116-2 from polysilicon layer 108.

To form spacer 120 and second contact portion 116-2, a hole is formed by removing a portion of base structure 104 from the back side (e.g., lower surface) after first contact portion 116-1 is formed. The hole extends in insulating layer 102 and polysilicon layer 108 until it is in contact with first contact portion 116-1. A dielectric material is then deposited in the hole. After a recess etch to remove a portion of the dielectric material to expose first contact portion 116-1, a conductive material is deposited over the dielectric layer to fill in the hole and form second contact portion 116-2. The portion of the dielectric material in polysilicon layer 108 forms spacer 120. Often, to ensure second contact portion 116-2 can form desirable contact with first contact portion 116-1, the hole is over etched into insulating structure 118. An upper surface of the hole (i.e., the upper surface of second contact portion 116-2) is often not flat, e.g., not coplanar with an upper surface of polysilicon layer 108. For example, protruding structures can be formed on the upper surface of second contact portion 116-2, as shown in FIG. 1. As described above, the formation of peripheral contact 116, especially second contact portion 116-2, can be length and complex. The existing fabrication process to form the peripheral contact, e.g., TSV, needs to be improved.

Various embodiments in accordance with the present disclosure provide improved semiconductor devices and fabrication methods thereof. According to the disclosed fabrication methods, to form a contact structure, the spacer structure is formed on the front side of the base structure. The spacer structure can be formed by an etch process followed by a deposition process to fill the opening structure formed by the etch process. The etch and the deposition processes, although they can be performed separately, can be incorporated into the current process flow without additional fabrication steps. For example, the etch process can be performed in any suitable etching/patterning process for forming another structure in the semiconductor device prior to the formation of the first contact portion, and the deposition process can be any suitable deposition process for forming another structure in the semiconductor device prior to the formation of the first contact portion. In some embodiments, the etch process is performed using a zero mask, which is employed for patterning structures in the substrate prior to any structures are formed on the base structure. In some embodiments, the etch process is the same patterning process that patterns structures (e.g., bottom-select-gate cut structures in a memory stack) on the base structure. In some embodiments, the deposition process can be the same deposition process that forms the insulating structure in which a memory stack is located. The fabrication process can thus be simplified.

The spacer structure can be formed from a trench structure or from a hole in the polysilicon layer. The second contact portion is located in the spacer structure and is insulated from the polysilicon layer. In some embodiments, forming the spacer structure from a hole in the conductive layer allows the lower surface of the first contact portion to be closer to the insulating layer, reducing the etching needed to form the hole that forms the second conductor portion, further simplifying the fabrication process.

Figure 2A:
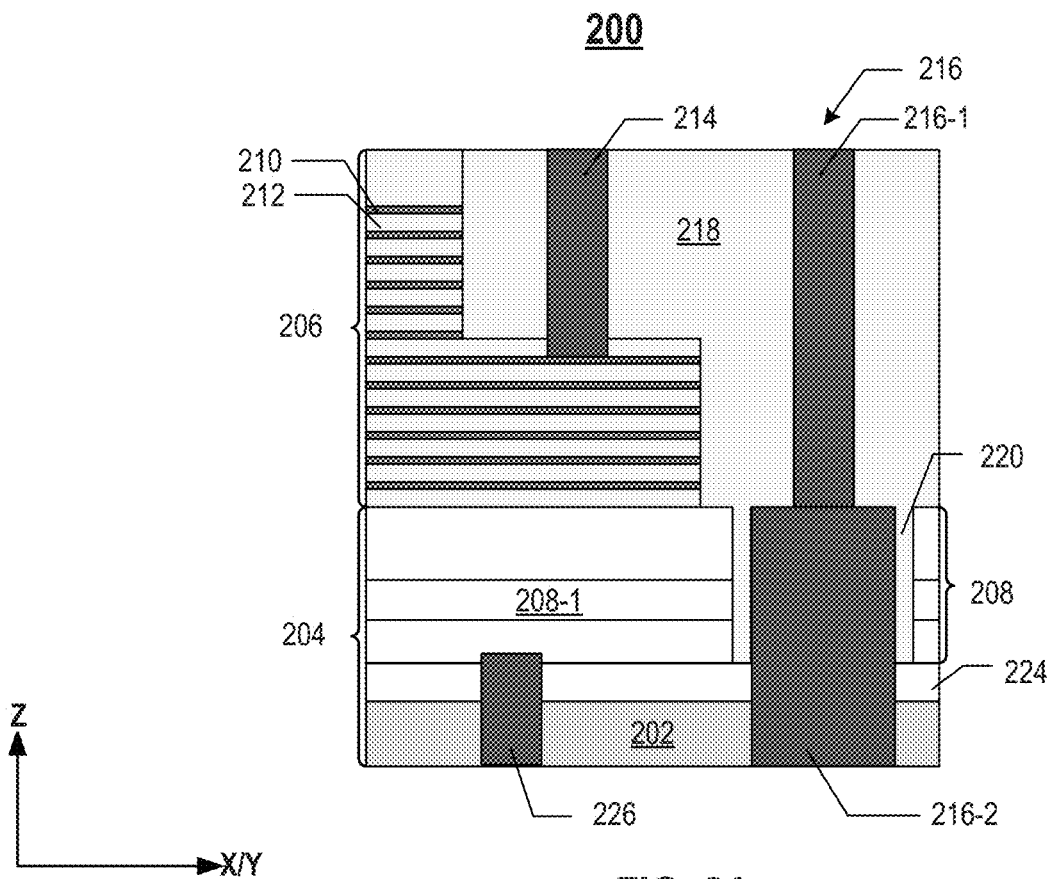
FIG. 2A illustrates a cross-sectional view of an exemplary contact structure in a semiconductor device, according to some embodiments of the present disclosure.
Figure 2B:
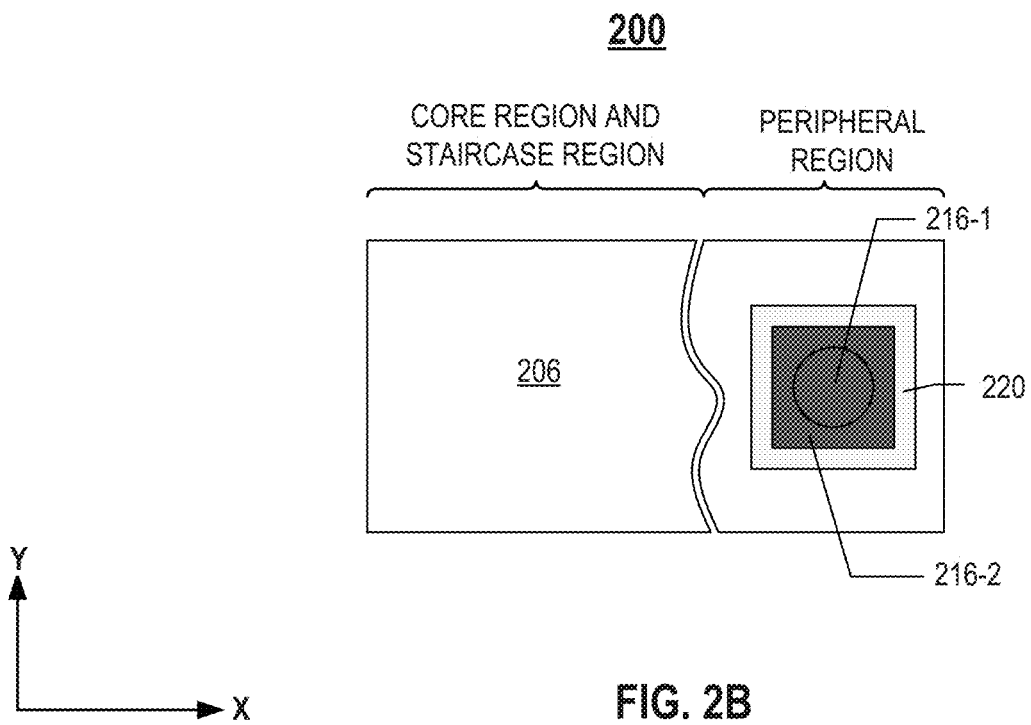
FIG. 2B illustrates a top view of the contact structure in FIG. 2A, according to some embodiments of the present disclosure.

FIG. 2A illustrates a cross-sectional view of an exemplary contact structure in a semiconductor device 200, according to some embodiments. FIG. 2B illustrates a top view of the contact structure in semiconductor device 200, according to some embodiments. For the ease of illustration, FIGS. 2A and 2B are described together.

As shown in FIG. 2A, semiconductor device 200 includes a base structure 204, an insulating structure 218 over base structure 204, and a contact structure 216 extending in insulating structure 218 and base structure 204. Semiconductor device 200 may also include a substrate on which base structure 204 is located on. In some embodiments, semiconductor device 200 includes a memory stack 206 over base structure 204 and in insulating structure 218. Semiconductor device 200 may include a word line contact 214, in insulating structure 218, in contact with and conductively connected to memory stack 206. In some embodiments, semiconductor device 200 includes a source contact structure 226 in contact with and conductively connected to base structure 204. In some embodiments, contact structure 216 is located in a peripheral region of semiconductor device 200. Memory stack 206 may be located in a core region and/or a staircase region of semiconductor device 200. As an example, in the present disclosure, the semiconductor devices are represented by 3D NAND memory devices, and contact structures, e.g., 216, are described as peripheral contacts in the 3D NAND memory devices. In some embodiments, contact structure 216 electrically connects a peripheral circuit and a contact pad (not shown) on opposite sides of base structure 204 of semiconductor device 200, such that the peripheral circuit can be electrically connected to external circuits through the contact pad. In some embodiments, contact structure 216 is electrically connected to a peripheral circuit and source contact structure 226 on opposite sides of base structure 204 of semiconductor device 200, such that the peripheral circuit can be electrically connected to source contact structure 226 to control the operation of the source of the 3D NAND memory device. It should be understood that the structures and fabrication methods to form these contact structures can be employed to form contact structures in any other suitable structures/devices as well.

The substrate of semiconductor device 200 can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, the substrate is a thinned substrate (e.g., a semiconductor layer), which was thinned by grinding, etching, chemical mechanical polishing (CMP), or any combination thereof. In some embodiments, the substrate is removed and not included in semiconductor device 200. It is noted that x, y, and z axes are included in figures of the present disclosure to further illustrate the spatial relationship of the components in semiconductor devices. As an example, the substrate of semiconductor device 200 includes two lateral surfaces (e.g., an upper surface and a lower surface) extending laterally in the x-direction and the y-direction (i.e., the lateral directions). The z-direction represents the direction perpendicular to the x-y plane (i.e., the plane formed by the x-direction and y-direction). As used herein, whether one component (e.g., a layer or a device) is "on," "above," or "below" another component (e.g., a layer or a device) of a semiconductor device (e.g., semiconductor device 200) is determined relative to the substrate of the semiconductor device in the z-direction (i.e., the vertical direction) when the substrate is positioned in the lowest plane of the semiconductor device in the z-direction. The same notion for describing the spatial relationships is applied throughout the present disclosure.

In some embodiments, semiconductor device 200 is part of a non-monolithic 3D NAND memory device, in which the components are formed separately on different substrates and then bonded in a face-to-face manner, a face-to-back manner, or a back-to-back manner Peripheral devices (not shown), such as any suitable digital, analog, and/or mixed-signal peripheral circuits used for facilitating the operation of semiconductor device 200, can be formed on a separate peripheral device substrate different from the memory array substrate on which the components shown in FIG. 2A are formed. It is understood that the memory array substrate may be removed from semiconductor device 200 as described below in detail, and the peripheral device substrate may become the substrate of semiconductor device 200. It is further understood that depending on the way how the peripheral device substrate and the memory array device substrate are bonded, the memory array devices (e.g., shown in FIG. 2A) may be in the original positions or may be flipped upside down in semiconductor device 200. For ease of reference, FIG. 2A depicts a state of semiconductor device 200 in which the memory array devices are in the original positions (i.e., not flipped upside down). However, it is understood that, in some examples, the memory array devices shown in FIG. 2A may be flipped upside down in semiconductor device 200, and their relative positions may be changed accordingly. The same notion for describing the spatial relationships is applied throughout the present disclosure.

As shown in FIG. 2A, base structure 204 can include an insulating layer 202 and a polysilicon layer 208 on insulating layer 202. Optionally, base structure 204 may include a stop layer 224 between insulating layer 202 and polysilicon layer 208. Insulating layer 202 can include one or more interlayer dielectric (ILD) layers (also known as "intermetal dielectric (IMD) layers") in which the interconnect lines and VIA contacts can form. The ILD layers of insulating layer 202 can include dielectric materials including, but not limited to, silicon oxide, silicon nitride, silicon oxynitride, low dielectric constant (low-k) dielectrics, or any combination thereof. In some embodiments, insulating layer 202 includes silicon oxide. Stop layer 224, if any, can be disposed directly on insulating layer 202. Stop layer 224 can be a single-layered structure or a multiple-layered structure. In some embodiments, stop layer 224 is a single-layered structure and includes a high dielectric constant (high-k) dielectric layer. In some embodiments, stop layer 224 is a double-layered structure and includes a first stop layer on a second stop layer. The first stop layer can include silicon nitride, and the second stop layer can include high-k dielectric. The high-k dielectric layer can include, for example, aluminum oxide, hafnium oxide, zirconium oxide, or titanium oxide, to name a few. In one example, stop layer 224 may include aluminum oxide. As described below in detail, since the function of stop layer 224 is to stop the etching of channel holes, it is understood that stop layer 224 may include any other suitable materials that have a relatively high etching selectivity (e.g., greater than about 5) with respect to the materials in the layers thereabove. In some embodiments, besides functioning as an etch stop layer, stop layer 224 also functions as the backside substrate thinning stop layer.

Polysilicon layer 208 may be disposed directly on stop layer 224. In some embodiments, a pad oxide layer (e.g., a silicon oxide layer) is disposed between stop layer 224 and polysilicon layer 208 to relax the stress between polysilicon layer 208 and stop layer 224 (e.g., an aluminum oxide layer). Polysilicon layer 208 includes an N-type doped polysilicon layer, according to some embodiments. That is, polysilicon layer 208 can be doped with any suitable N-type dopants, such as phosphorus (P), arsenic (Ar), or antimony (Sb), which contribute free electrons and increase the conductivity of the intrinsic semiconductor. Polysilicon layer 208 may include a polysilicon sublayer 208-1 between the top and lower surfaces of polysilicon layer 108 and may be conductively connected to the semiconductor channel of a 3D NAND memory string and the source contact structure of semiconductor device 200. As described below in detail, due to a diffusion process, polysilicon layer 208 can have a suitable uniform doping concentration profile in the vertical direction. It is understood that as sublayer 208-1 of polysilicon layer 208 may have the same polysilicon material as the rest of polysilicon layer 208, and the doping concentration may be uniform in polysilicon layer 208 after diffusion, sublayer 208-1 may not be distinguishable from the rest of polysilicon layer 208 in semiconductor device 200. Nevertheless, sublayer 208-1 refers to the part of polysilicon layer 208 that is in contact with the semiconductor channel, instead of the memory film, in the lower portion of the channel structure.

Although FIG. 2A shows that polysilicon layer 208 is above stop layer 224, as described above, it is understood that stop layer 224 may be above polysilicon layer 208 in some examples because the memory array devices shown in FIG. 2A may be flipped upside down, and their relative positions may be changed accordingly in semiconductor device 200. In some embodiments, the memory array devices shown in FIG. 2A are flipped upside down (in the top) and bonded to peripheral devices (in the bottom) in semiconductor device 200, such that stop layer 224 is above polysilicon layer 208. Although in the present disclosure polysilicon layer 208 is described as the conductive layer for facilitating electrical coupling between the source contact of semiconductor device 200 and memory stack 206, in various embodiments, any other suitable conductive material may also be formed between memory stack 206 and insulating layer 202 for performing similar/same functions as polysilicon layer 208.

Memory stack 206 can include a plurality of interleaved conductor layers 210 and dielectric layers 212 over polysilicon layer 208. Conductor layers 210 and dielectric layers 212 in memory stack 206 can alternate in the vertical direction. In other words, except for the ones at the top or bottom of memory stack 206, each conductor layer 210 can be adjoined by two dielectric layers 212 on both sides, and each dielectric layer 212 can be adjoined by two conductor layers 210 on both sides. Conductor layers 210 can include conductive materials including, but not limited to, W, Co, Cu, Al, polysilicon, doped silicon, silicides, or any combination thereof. Each conductor layer 210 can include a gate electrode (gate line) surrounded by an adhesion layer and a gate dielectric layer. The gate electrode of conductor layer 210 can extend laterally as a word line, ending at one or more staircase structures of memory stack 206. Dielectric layers 212 can include dielectric materials including, but not limited to, silicon oxide, silicon nitride, silicon oxynitride, or any combination thereof. Memory stack 206 may have a staircase structure, which includes a plurality of stairs, e.g., extending laterally along the x/y direction. Each stair may include one or more pairs of conductor layer 210 and dielectric layers 212 (referred to as conductor/dielectric layer pairs). A word line contact 214, extending in insulating structure 218, may be in contact with and conductively connected to a top conductor layer 210 of a respective stair, as shown in FIG. 2A. Word line contact 214 can include conductive materials including, but not limited to, W, Co, Cu, Al, polysilicon, doped silicon, silicides, or any combination thereof. Insulating structure 218 can include dielectric materials including, but not limited to, silicon oxide, silicon nitride, silicon oxynitride, or any combination thereof.

Figure 6:
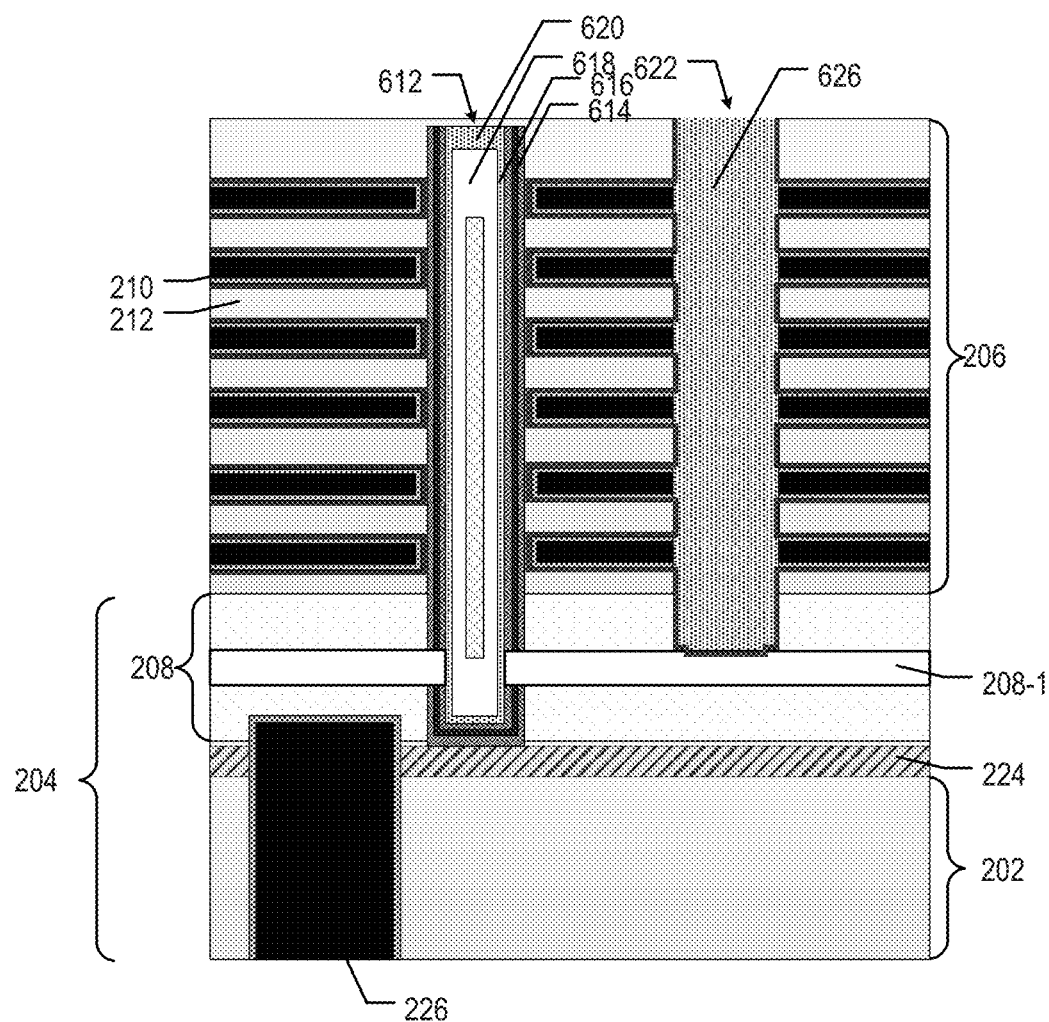
FIG. 6 illustrates part of an exemplary semiconductor device, according to various embodiments of the present disclosure.

In some embodiments, semiconductor device 200 is a 3D NAND memory device and includes a plurality of memory cells formed in memory stack 206. The memory cells may be formed by the intersections of 3D NAND memory strings in memory stack 206 and conductor layers 210. FIG. 6 illustrates a cross-sectional view of a channel structure in memory stack 206.

As shown in FIG. 6, a channel structure 612 extends vertically through memory stack 206 and polysilicon layer 208, stopping at stop layer 224, if any. That is, channel structure 612 can include two portions: the lower portion surrounded by polysilicon layer 208 (i.e., below the interface between polysilicon layer 208 and memory stack 206) and the upper portion surrounded by memory stack 206 (i.e., above the interface between polysilicon layer 208 and memory stack 206). As used herein, the "upper portion/end" of a component (e.g., channel structure 612) is the portion/end farther away from the substrate in the z-direction, and the "lower portion/end" of the component (e.g., channel structure 612) is the portion/end closer to the substrate in the z-direction when the substrate is positioned in the lowest plane of semiconductor device 200. In some embodiments, each channel structure 612 does not extend further beyond stop layer 224 as the etching of the channel hole being stopped by stop layer 224. For example, the lower end of channel structure 612 may be nominally flush with the upper surface of stop layer 224.

Channel structure 612 can include a channel hole filled with semiconductor material(s) (e.g., as a semiconductor channel 616) and dielectric material(s) (e.g., as a memory film 614). In some embodiments, semiconductor channel 616 includes silicon, such as amorphous silicon, polysilicon, or single crystalline silicon. In one example, semiconductor channel 616 includes polysilicon. In some embodiments, memory film 614 is a composite layer including a tunneling layer, a storage layer (also known as a "charge trap layer"), and a blocking layer. The remaining space of the channel hole can be partially or fully filled with a capping layer 618 including dielectric materials, such as silicon oxide, and/or an air gap. Channel structure 612 can have a cylinder shape (e.g., a pillar shape). Capping layer 618, semiconductor channel 616, the tunneling layer, the storage layer, and the blocking layer of memory film 614 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, or any combination thereof. The blocking layer can include silicon oxide, silicon oxynitride, high-k dielectrics, or any combination thereof. In one example, memory film 614 can include a composite layer of silicon oxide/silicon oxynitride/silicon oxide (ONO). In some embodiments, channel structure 612 further includes a channel plug 620 at the top of the upper portion of channel structure 612. Channel plug 620 can include semiconductor materials (e.g., polysilicon). In some embodiments, channel plug 620 functions as the drain of the NAND memory string.

As shown in FIG. 6, part of semiconductor channel 616 along the sidewall of channel structure 612 (e.g., in the lower portion of channel structure 612) is in contact with polysilicon sublayer 208-1, according to some embodiments. That is, memory film 614 is disconnected in the lower portion of channel structure 612 that abuts sublayer 208-1 of polysilicon layer 208, exposing semiconductor channel 616 to be in contact with the surrounding polysilicon sublayer 208-1, according to some embodiments. As a result, polysilicon sublayer 208-1 surrounding and in contact with semiconductor channel 616 can work as the "sidewall SEG" of channel structure 612. In some embodiments, source contact structure 226 is in contact with polysilicon layer 208 and is electrically connected to semiconductor channel 616 through polysilicon layer 208.

As shown in FIG. 6, in some embodiments, semiconductor device 200 further includes an insulating spacer 622 extending vertically through interleaved conductor layers 210 and dielectric layers 212 of memory stack 206. In some embodiments, insulating spacer 622 extends into polysilicon layer 208 and stops at polysilicon sublayer 208-1, according to some embodiments. In some embodiments, the lower end of insulating spacer 622 is nominally flush with the upper surface of polysilicon sublayer 208-1. Each insulating spacer 622 can also extend laterally to separate channel structures 612 into a plurality of blocks. Different from the slit structures in some 3D NAND memory devices, insulating spacer 622 does not include any contact therein (i.e., not functioning as the source contact), according to some embodiments. In some embodiments, each insulating spacer 622 includes an opening (e.g., a slit) filled with one or more dielectric materials, including, but not limited to, silicon oxide, silicon nitride, silicon oxynitride, or any combination thereof. In one example, each insulating spacer 622 may be filled with silicon oxide as an insulator core 626 and high-k dielectrics connecting with the gate dielectric layers.

Source contact structure 226 may extend vertically through insulating layer 202 and stop layer 224 (if any) from the opposite side of polysilicon layer 208 with respect to stop layer 224 (i.e., the backside) to be in contact with polysilicon layer 208. It is understood that the depth that source contact structure 226 extends into polysilicon layer 208 may vary in different examples. Source contact structure 226 can electrically connect the source of the NAND memory strings of semiconductor device 200 to the peripheral devices through polysilicon layer 208 from the backside of the memory array substrate (removed) and thus, can be referred to herein as a "backside source pick up" as well. Source contact structure 226 can include any suitable types of contacts. In some embodiments, source contact structure 226 includes a VIA contact. In some embodiments, source contact structure 226 includes a wall-shaped contact extending laterally. Source contact structure 226 can include one or more conductive layers, such as a metal layer, for example, tungsten (W), cobalt (Co), copper (Cu), or aluminum (Al) or a silicide layer surrounded by an adhesive layer (e.g., titanium nitride (TiN)).

Referring back to FIGS. 2A and 2B, contact structure 216 may extend in insulating structure 218 and base structure 204 and may be conductively connected to any peripheral circuits for the operation of memory cells. In some embodiments, contact structure 216 extends through polysilicon layer 208 and insulating layer 202. Contact structure 216 may include a first contact portion 216-1 extending in insulating structure 218 and a second contact portion 216-2 extending in base structure 204 (e.g., polysilicon layer 208 and insulating layer 202, and stop layer 224, if any). First and second contact portions 216-1 and 216-2 may be in contact with and conductively connected to each other at a contact interface. Semiconductor device 200 may also include a spacer structure 220 in polysilicon layer 208 and surrounding second contact portion 216-2 such that second contact portion 216-2 is insulated from polysilicon layer 208.

In some embodiments, as shown in FIG. 2B, a lateral cross-sectional area of second contact portion 216-2 is greater than or equal to a lateral cross-sectional area of first contact portion 216-1 such that first contact portion 216-1 is fully overlapped with second contact portion 216-2. The lateral cross-sections of first and second contact portions 216-1 and 216-2 can each have any suitable shapes such as oval, squared, rectangular, and circular shapes. For example, the lateral cross-section of first and second contact portions 216-1 and 216-2 may respectively be nominally circular and squared. The upper surface of second contact portion 216-2 may be sufficiently flat, e.g., nominally leveled/coplanar with the upper surface of polysilicon layer 208. The contact interface between first and second contact portions 216-1 and 216-2 may be coplanar (or at least nominally coplanar) with the upper surface of polysilicon layer 208. That is, the lower surface of first contact portion 216-1 and the upper surface of second contact portion 216-2 may each be coplanar (or at least nominally coplanar with) with the upper surface of polysilicon layer 208. In some embodiments, first and second contact portions 216-1 and 216-2 can each be made of tungsten, cobalt, copper, or aluminum, and/or silicide.

Spacer structure 220 may be in polysilicon layer 208, in contact with and surrounding second contact portion 216-2 such that second contact portion 216-2 (or contact structure 216) is insulated from polysilicon layer 208. The lateral dimensions of spacer structure 220 (e.g., in the x-y plane) may be sufficiently large to insulate second contact portion 216-2 from polysilicon layer 208 in all directions. An upper surface of spacer structure 220, in contact with insulating structure 218, may be coplanar with the upper surface of polysilicon layer 208. A lower surface of spacer structure 220 may be in contact with insulating layer 202 (or stop layer 224 if any) such that second contact portion 216-2 is fully insulated from polysilicon layer 208. In various embodiments, the lower surface of spacer structure 220 can be leveled with or below the lower surface of polysilicon layer 208. For example, the lower surface of spacer structure 220 may be in stop layer 224 or in insulating layer 202. In some embodiments, spacer structure 220 includes a dielectric material, such as silicon oxide, silicon nitride, silicon oxynitride, or a combination thereof. It should be understood that, if spacer structure 220 includes the same material as insulating structure 218 and/or spacer structure 220, the upper surface and/or lower surface of spacer structure 220 may not be distinguishable.

Figure 3A:
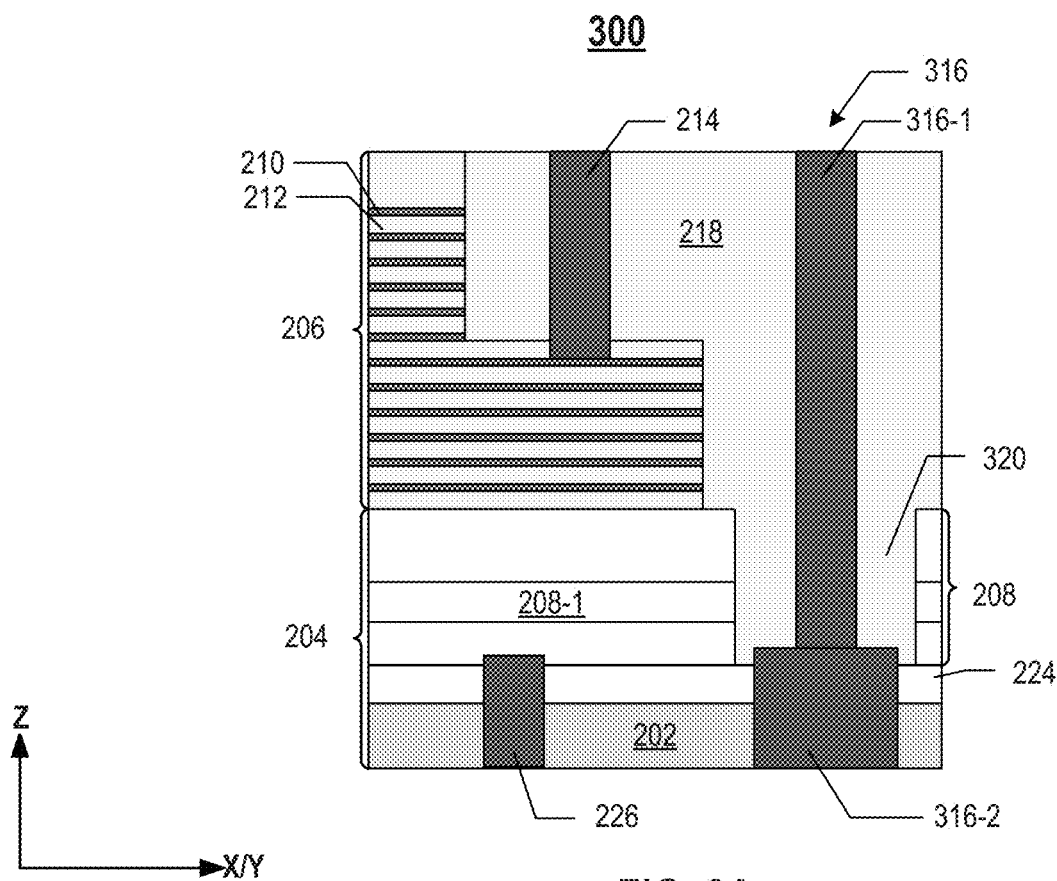
FIG. 3A illustrates a cross-sectional view of another exemplary contact structure in a semiconductor device, according to some embodiments of the present disclosure.
Figure 3B:
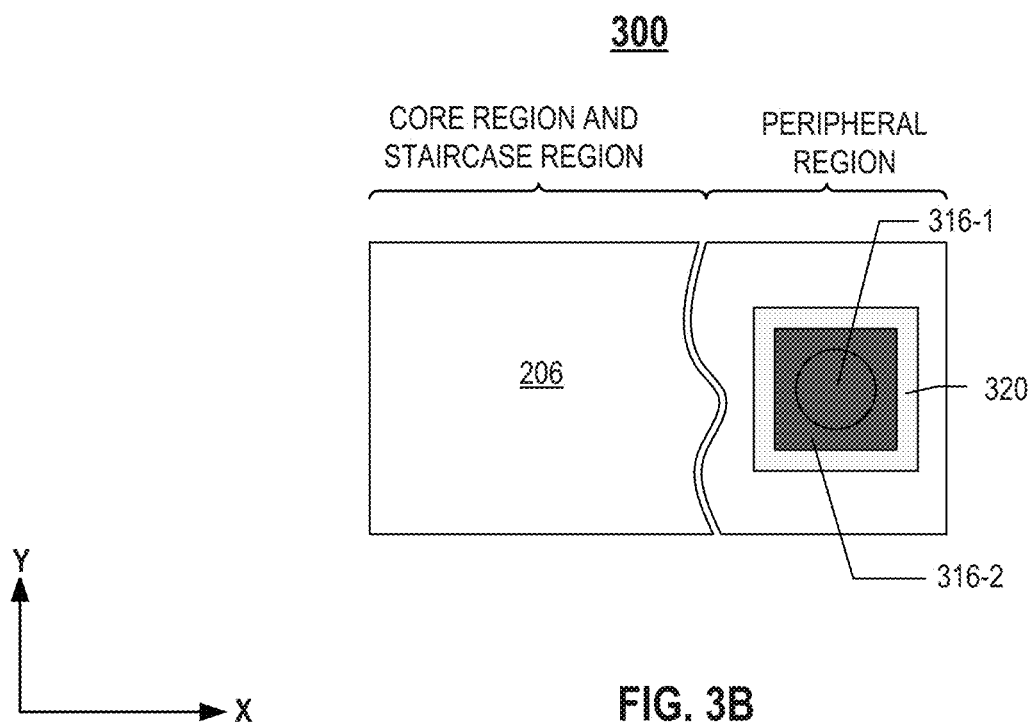
FIG. 3B illustrates a top view of the contact structure in FIG. 3A, according to some embodiments of the present disclosure.

FIG. 3A illustrates a cross-sectional view of another exemplary contact structure in a semiconductor device 300, according to some embodiments. FIG. 3B illustrates a top view of the contact structure in semiconductor device 300, according to some embodiments. For the ease of illustration, FIGS. 3A and 3B are described together, and the details of other same structures in both semiconductor devices 200 and 300 are not repeated for ease of description.

As shown in FIG. 3A, semiconductor device 300 includes a contact structure 316 and a spacer structure 320. Contact structure 316 may include a first contact portion 316-1 and a second contact portion 316-2 in contact with and conductively connected to each other. Contact structure 316 may extend through spacer structure 320 such that spacer structure 320 insulates contact structure 316 from polysilicon layer 208. Different from contact structure 216, the contact interface between first and second contact portions 316-1 and 316-2 may be lower than the upper surface of polysilicon layer 208. For example, the contact interface (e.g., the lower surface of first contact portion 316-1 and the upper surface of second contact portion 316-2) may be between the upper and lower surfaces of polysilicon layer 208. In some embodiments, the contact interface may be coplanar (or at least nominally coplanar with) the lower surface of polysilicon layer 208. That is, first contact portion 316-1 may extend in (e.g., extend through) polysilicon layer 208. Accordingly, second contact portion 316-2 may have a reduced thickness in spacer structure 320.

Different from spacer structure 220, spacer structure 320 surrounds at least a portion of first contact portion 316-1 such that first contact portion 316-1 is insulated from polysilicon layer 208. If the contact interface between first and second contact portions 316-1 and 316-2 is between upper and lower surfaces of polysilicon layer 208, spacer structure 320 may also insulate a portion of second contact portion 316-2 from polysilicon layer 208. In some embodiments, as shown in FIG. 3B, a lateral cross-sectional area of second contact portion 316-2 is greater than or equal to a lateral cross-sectional area of first contact portion 316-1 such that first contact portion 316-1 is fully overlapped with second contact portion 316-2. The materials and shapes of first and second contact portions 316-1 and 316-2, and spacer structure 320 may respectively be similar to or the same as those for first and second contact portions 216-1 and 216-2 and spacer structure 220, and the detailed description is not repeated herein.

Figure 7:
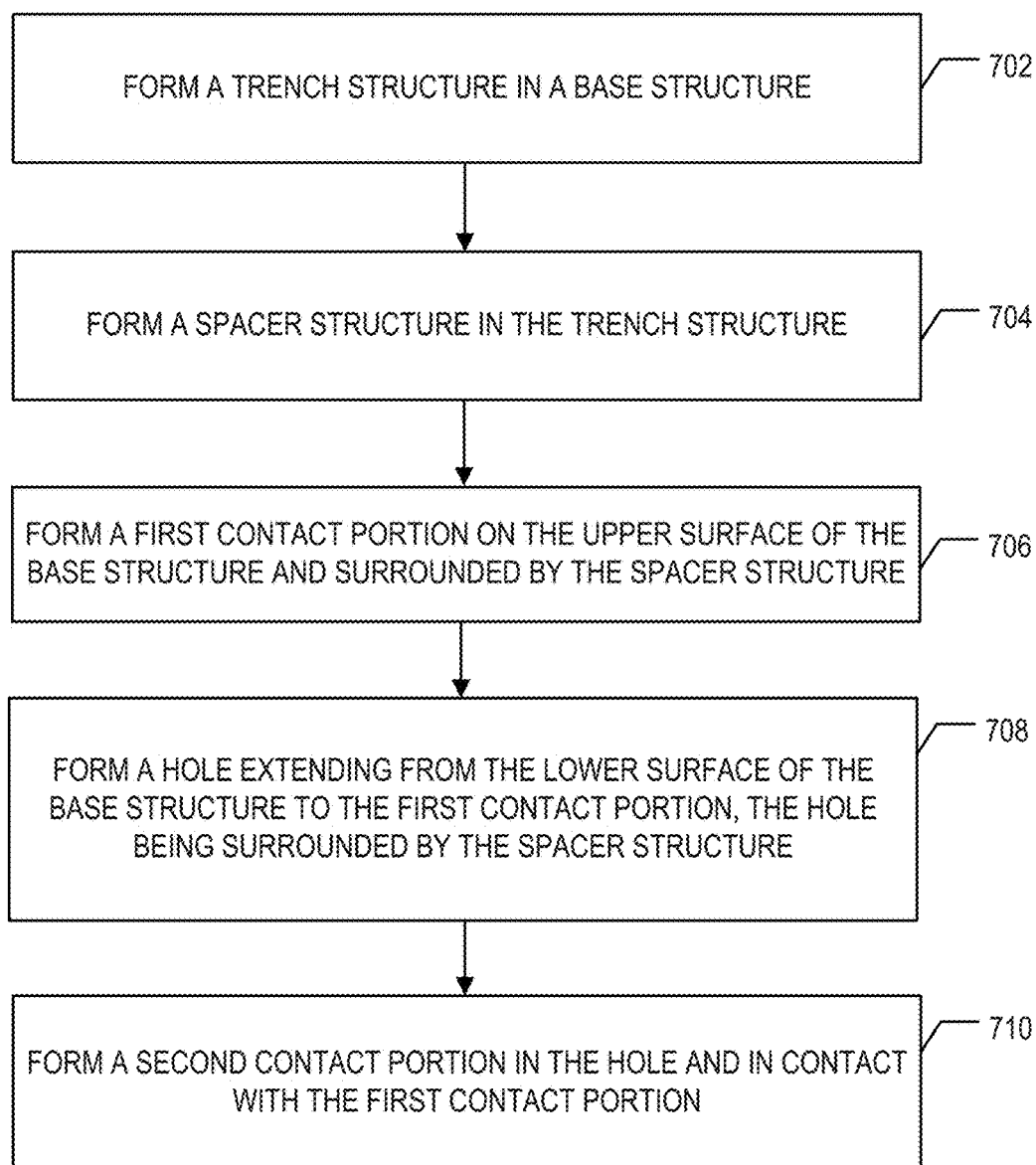
FIG. 7 illustrates a flowchart of an exemplary method for forming a contact structure, according to some embodiments of the present disclosure.

FIGS. 4A-4D illustrate a fabrication process for forming a semiconductor device, according to some embodiments of the present disclosure. FIG. 7 illustrates a flowchart of a method 700 for forming a semiconductor device, according to some embodiments of the present disclosure. Examples of the semiconductor device depicted in FIGS. 4A-4D and 7 include the semiconductor devices depicted in FIGS. 2A and 2B. FIGS. 4A-4D and 7 will be described together. It is understood that the operations shown in method 700 are not exhaustive and that other operations can be performed as well before, after, or between any of the illustrated operations. Further, some of the operations may be performed simultaneously, or in a different order than shown in FIG. 7.

Figure 4A:
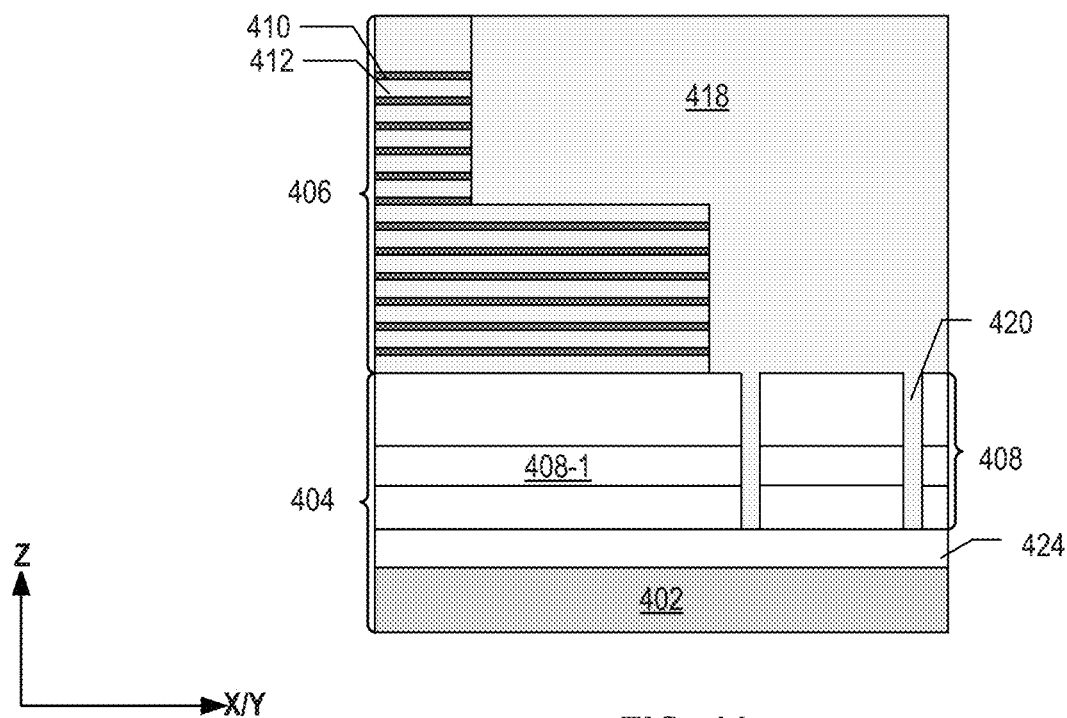
FIGS. 4A-4D illustrate an exemplary fabrication process for forming a contact structure, according to some embodiments of the present disclosure.

Referring to FIG. 7, method 700 starts at operations 702 and 704, in which a trench structure is formed in a base structure, and a spacer structure is formed in the trench structure. FIG. 4A illustrates a corresponding structure.

As shown in FIG. 4A, at the beginning of the fabrication process, a trench structure may be formed in a base structure 404. The shapes and depth of the trench structure may correspond to those of the subsequently-formed spacer structure. Base structure 404 may include a polysilicon layer 408 on a stop layer 424, which is further on an insulating layer 402. Polysilicon layer 408 may include a sacrificial sublayer, which subsequently forms a polysilicon sublayer in polysilicon layer 408. The detailed description of polysilicon layer 408, stop layer 424, and insulating layer 402 may be referred to the description of polysilicon layer 208, stop layer 224, and insulating layer 202, and is not repeated herein.

The trench structure may enclose an area in the peripheral region of base structure 404 (e.g., polysilicon layer 408) such that the enclosed area (e.g., in polysilicon layer 408) may be insulated from the portion of polysilicon layer 408 outside of the trench structure. In some embodiments, the trench structure may extend from the upper surface of polysilicon layer 408 to at least the lower surface of polysilicon layer 408. For example, the lower surface of the trench structure may stop on or in stop layer 424. In some embodiments, the lower surface of polysilicon layer 408 stops at stop layer 424. A thickness/depth of the trench structure may at least be the thickness of polysilicon layer 408 along the z-direction. The trench structure may be formed by any suitable patterning process such as dry etch and/or wet etch, following a photolithography process.

Base structure 404 may be formed on one side (e.g., the first side) of a substrate. The substrate can be a silicon substrate or a carrier substrate, made of any suitable materials, such as semiconductors, glass, sapphire, plastic, to name a few. In some embodiments, insulating layer 402 includes a dielectric material such as silicon oxide. In some embodiments, stop layer 424 includes a high-k dielectric material such as aluminum oxide. In some embodiments, polysilicon layer 408 includes polysilicon having a uniform doping profile. In some embodiments, insulating layer 402, stop layer 424, and polysilicon layer 408 are sequentially formed on the substrate by any suitable film deposition methods such as chemical vapor deposition (CVD), physical vapor deposition (PVD), atomic layer deposition (ALD), electroplating, electroless deposition, and a combination thereof. Subsequently, the substrate may be removed or thinned for forming various structures such as contact vias. In some embodiments, the substrate is removed or thinned at a suitable time of the fabrication process such that contact vias can be formed from the lower surface of base structure 404.

A dielectric stack, which subsequently forms the memory stack, can be formed on base structure 404 on the substrate. The dielectric stack can include a plurality of interleaved sacrificial layers and dielectric layers. In some embodiments, the dielectric stack, having a plurality pairs of a sacrificial layer and a dielectric layer, is formed on polysilicon layer 408. The interleaved sacrificial layers and dielectric layers can be alternatively deposited on polysilicon layer 408 to form the dielectric stack. In some embodiments, each dielectric layer includes a layer of silicon oxide, and each sacrificial layer includes a layer of silicon nitride. In some embodiments, a pad oxide layer (e.g., silicon oxide layer, not shown) is formed between polysilicon layer 408 and the dielectric stack. An insulating structure 418, having a suitable dielectric material such as silicon oxide, can be deposited over the dielectric stack and base structure 404 at a suitable time during the fabrication process such that the dielectric stack is located in insulating structure 418. The dielectric stack, insulating structure 418, and the pad oxide layer (if any) can be formed by one or more thin film deposition processes including, but not limited to, CVD, PVD, ALD, or any combination thereof.

The trench structure can be formed, in the peripheral region of the semiconductor device, at any suitable time during the fabrication process, before the first contact portion of a contact structure is formed. In some embodiments, the trench structure is formed by patterning base structure 404 (e.g., polysilicon layer 408) using a "zero mask," which is used for patterning base structure 404 before any structure is formed thereon. In some embodiments, the trench structure is formed by patterning the dielectric stack, e.g., for forming bottom-select-gate cut structures, after one or more pairs of sacrificial layer and dielectric layer are formed on base structure 404. The pattern for forming the trench structure may thus be incorporated into existing patterning masks such that the etching of base structure 404 for forming the trench structure can be performed with other existing etching operations, reducing the number of total etching operations. In various embodiments, the trench structure can also be formed by a separate patterning/etching process, or at the same time with other suitable structures, depending on the fabrication process.

A spacer structure 420 may be formed in the trench structure. A dielectric material, e.g., silicon oxide, can be deposited to fill the trench structure, forming spacer structure 420. The dielectric material may be deposited by any suitable film deposition method such as CVD, PVD, ALD, and a combination thereof, and can be deposited at any suitable time during the fabrication process, before the first contact portion of a contact structure is formed. In some embodiments, spacer structure 420 can be formed by the same deposition process that forms insulating structure 418, after the formation of the dielectric stack. In some embodiments, spacer structure 420 can be formed by the same deposition process that forms the bottom-select-gate cut structures in the dielectric stack, after one or more pairs of sacrificial layer and dielectric layer are formed on base structure 404 and before the entire dielectric stack is formed. In various embodiments, spacer structure 420 can also be formed by a separate deposition process, or be filled with the dielectric material at the same time with other suitable structures, depending on the fabrication process.

Before the formation of the contact structure, other structures, although not shown in FIGS. 4A-4D, can be formed in the semiconductor device (e.g., the dielectric stack). In some embodiments, a channel structure extending vertically through the dielectric stack, polysilicon layer 408, and stopping at stop layer 424 is formed. In some embodiments, to form the channel structure, a channel hole, e.g., an opening, extending vertically through the dielectric stack, and polysilicon layer 408, is formed, and a memory film (e.g., a blocking layer, a storage layer, and a tunneling layer) and a semiconductor channel are sequentially formed along a sidewall of the channel hole. The deposition of the films and layers in the channel hole may include ALD, CVD, PVD, any other suitable processes, or any combination thereof. In some embodiments, a channel plug is formed above and in contact with the semiconductor channel. In some embodiments, fabrication processes for forming the channel hole include wet etching and/or dry etching processes, such as deep-ion reactive etching (DRIE). The etching of the channel hole continues until being stopped by stop layer 424, due to the etching selectivity between the materials of stop layer 424 and polysilicon layer 408, according to some embodiments.

To conductively connect polysilicon layer 408 and the channel structure, a polysilicon sublayer 408-1, in contact with and conductively connected to the semiconductor channel, is formed in polysilicon layer 408. In some embodiments, a lower portion of the memory film is removed such that the memory film becomes disconnected. Polysilicon sublayer 408-1, in contact with the semiconductor channel, can be formed by replacing the sacrificial sublayer with a sublayer of polysilicon. The formation of polysilicon sublayer 408-1 may include suitable dry etch and/or wet etch processes, CVD, PVD, ALD, and a combination thereof. An insulating spacer, dividing the memory cells into a plurality of blocks, can also be formed. The formation of the insulating spacer may include suitable dry etch and/or wet etch processes, CVD, PVD, ALD, and a combination thereof. A gate replacement process can be performed to replace the sacrificial layers in the dielectric stack to form a plurality of conductor layers. A memory stack 406, having a plurality of interleaved conductor layers 410 and dielectric layers 412, can be formed on polysilicon layer 408. The gate replacement process may include a suitable isotropic etching process, CVD, PVD, ALD, and a combination thereof. The channel structures, extending through memory stack 406, may be in contact with and conductively connected to polysilicon layer 408 through the semiconductor channel. In some embodiments, memory stack 406 may be repetitively patterned to form a staircase structure, which includes a plurality of stairs extending laterally (e.g., along the x/y-direction). The patterning process of memory stack 406 may include repetitive photolithography processes and recess etches (e.g., an isotropic etching process).

Figure 4B:
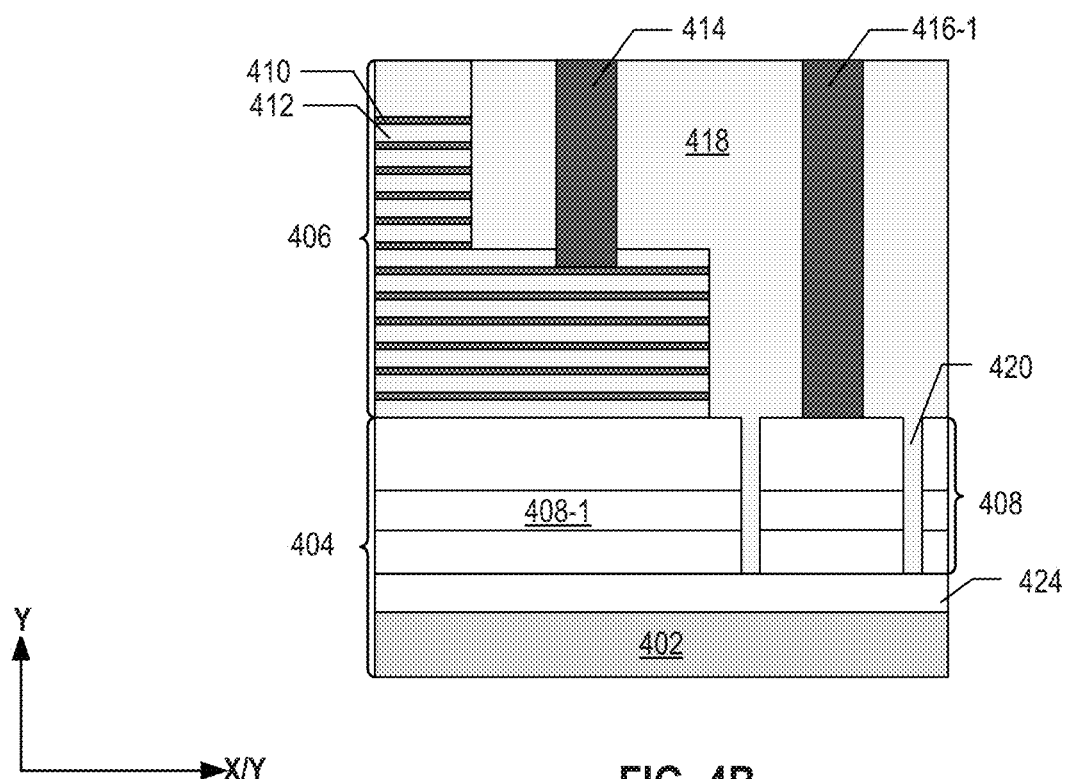

Referring back to FIG. 7, method 700 proceeds to operation 706, in which a first contact portion is formed on the upper surface of the base structure and surrounded by the spacer structure. FIG. 4B illustrates a corresponding structure.

As shown in FIG. 4B, a first contact portion 416-1 may be formed in insulating structure 418 and landed on the upper surface of base structure 404. The lower surface of first contact portion 416-1 may be in the enclosed area in polysilicon layer 408 defined by spacer structure 420 such that, laterally, first contact portion 416-1 is surrounded by spacer structure 420. In some embodiments, the lower surface of first contact portion 416-1 extends below the upper surface of polysilicon layer 408. In some embodiments, first contact portion 416-1 is formed by the same process that forms a word line contact 414, which lands on a respective stair to form a conductive connection with conductor layer 410 in the stair. First contact portion 416-1 and word line contact 414 may each include a suitable conductive material such as tungsten.

The formation of first contact portion 416-1 and word line contact 414 may include a patterning process followed by a suitable film deposition process. The patterning process may remove portions of insulating structure 418 to form openings that correspond to the locations and positions of first contact portion 416-1 and word line contact 414. In some embodiments, the opening for first contact portion 416-1 extends in insulating structure 418 and exposes the enclosed area in polysilicon layer 408. In some embodiments, the opening for word line contact 414 extends in insulating structure 418 and exposes conductor layer 410 in the corresponding stair. The deposition of the conductive material may include CVD, PVD, ALD, electroplating, electroless plating, and a combination thereof.

Figure 4C:
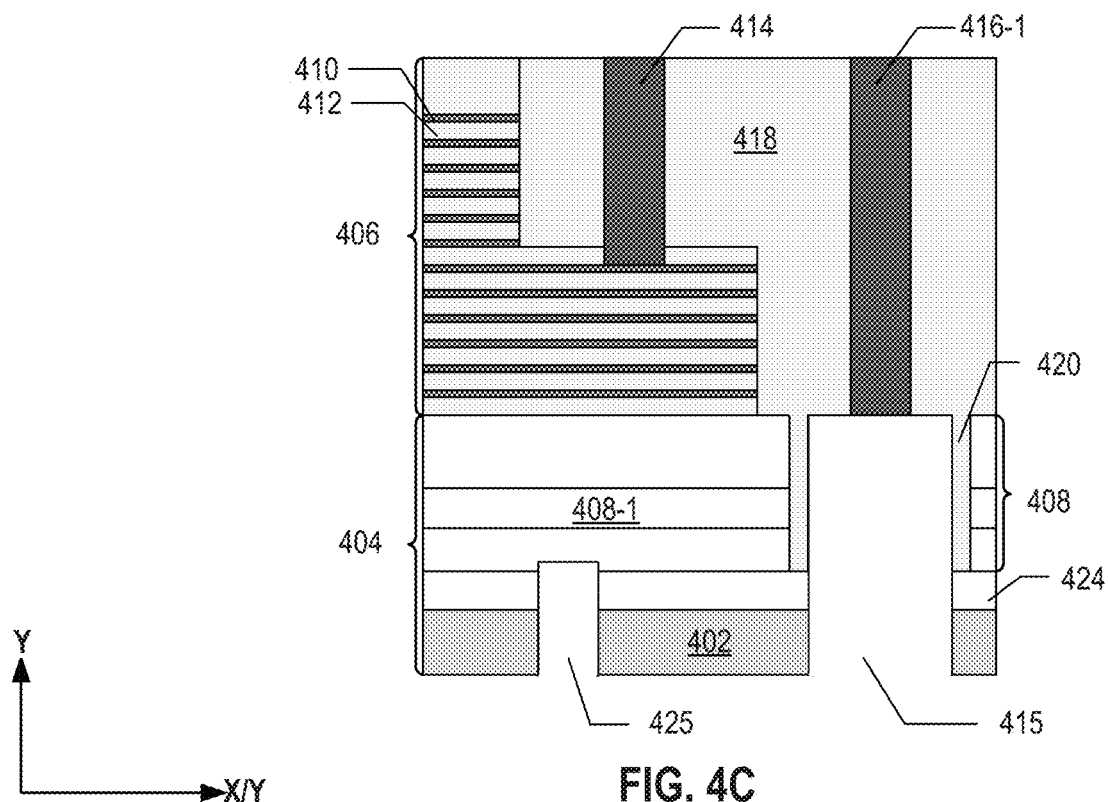

Referring back to FIG. 7, method 700 proceeds to operation 708, in which a hole is formed extending from the lower surface of the base structure to the first contact portion, the hole being surrounded by the spacer structure. FIG. 4C illustrates a corresponding structure.

As shown in FIG. 4C, a hole 415 may be formed extending from the lower surface of base structure 404 to first contact portion 416-1. Hole 415 may be surrounded by the spacer structure 420. A portion of base structure 404, i.e., a portion of insulating layer 402, stop layer 424, and polysilicon layer 408, may be removed to form hole 415, which extends from the lower surface of base structure 404, e.g., the lower surface of insulating layer 402, to first contact portion 416-1. Hole 415 may be in contact with and exposing first contact portion 416-1. As shown in FIG. 4C, the portion of hole 415 in polysilicon layer 408 may be located in the enclosed area defined by spacer structure 420. The lateral dimensions of hole 415 may be sufficiently large to fully contact first contact portion 416-1, and may be sufficiently small to not exceed the enclosed area surrounded by spacer structure 420. In some embodiments, hole 415 is isolated from polysilicon layer 408 outside of spacer structure 420. In some embodiments, the lateral dimensions of hole 415 may be less than or equal to the lateral dimensions of the enclosed area.

In some embodiments, another hole 425 for forming a source contact structure may be formed in the same patterning process that forms hole 415. Hole 425 may extend from the lower surface of base structure 404, e.g., insulating layer 402, to polysilicon layer 408. The patterning process may include a suitable etching process, e.g., dry etch and/or wet etch processes.

In various embodiments, the substrate, on which base structure 404 is formed, is removed prior to the formation of hole 415. The substrate may be removed at any suitable time during the fabrication process by a grinding process, CMP, recess etch, or a combination thereof. In some embodiments, the lower surface of base structure 404 is the lower surface of insulating layer 402.

Figure 4D:
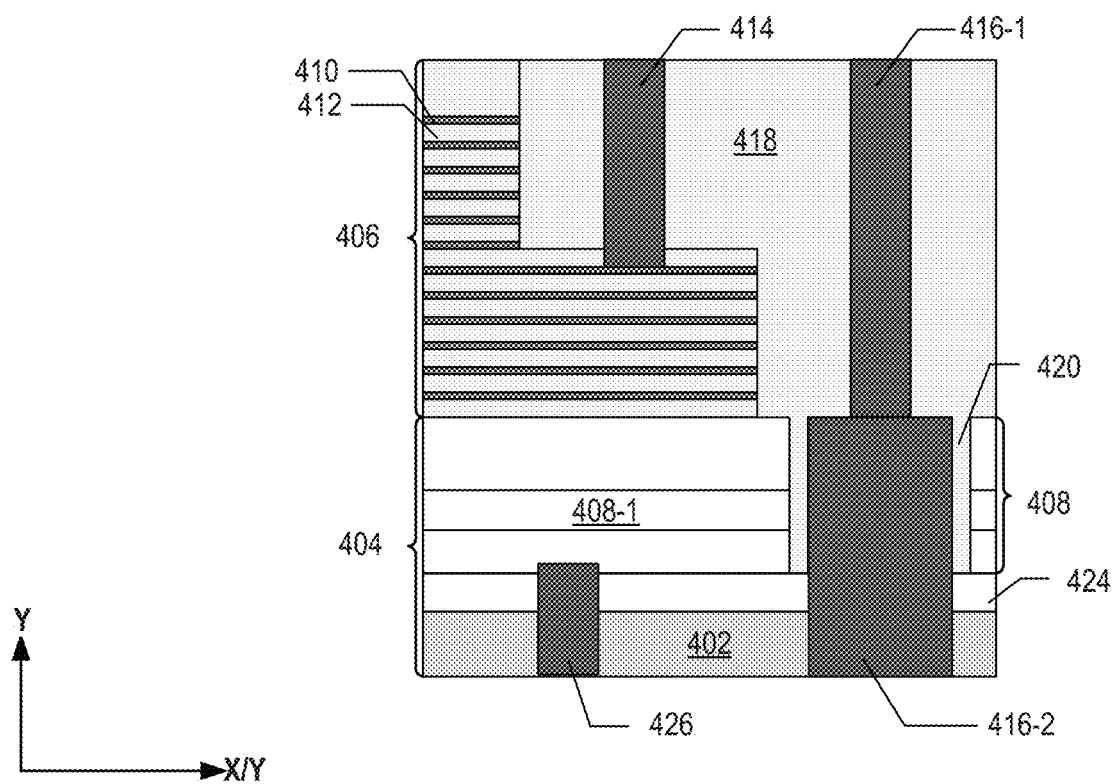

Referring back to FIG. 7, method 700 proceeds to operation 710, in which a second contact portion is formed in the hole, in contact with the first contact portion. FIG. 4D illustrates a corresponding structure.

As shown in FIG. 4D, a second contact portion 416-2 may be formed in hole 415, in contact with first contact portion 416-1. A conductive material, such as tungsten, can be deposited to fill in hole 415 and the other hole 425. Any suitable film deposition method can be performed to deposit the conductive material. For example, the deposition method may include CVD, PVD, ALD, electroplating, electroless plating, or a combination thereof. In some embodiments, a source contact structure 426 may be formed by the same deposition process that forms second contact portion 416-2. A contact structure 416, having first and second contact portions 416-1 and 416-2 in contact with each other, may be formed extending insulating structure 418 and base structure 404 (e.g., spacer structure 420), connecting peripheral circuits of the semiconductor device. Meanwhile, source contact structure 426 may be formed in base structure 404 in contact with and conductively connected to polysilicon layer 408. Channel structures may then be conductively connected to the source through polysilicon layer 408 and source contact structure 426.

Figure 8:
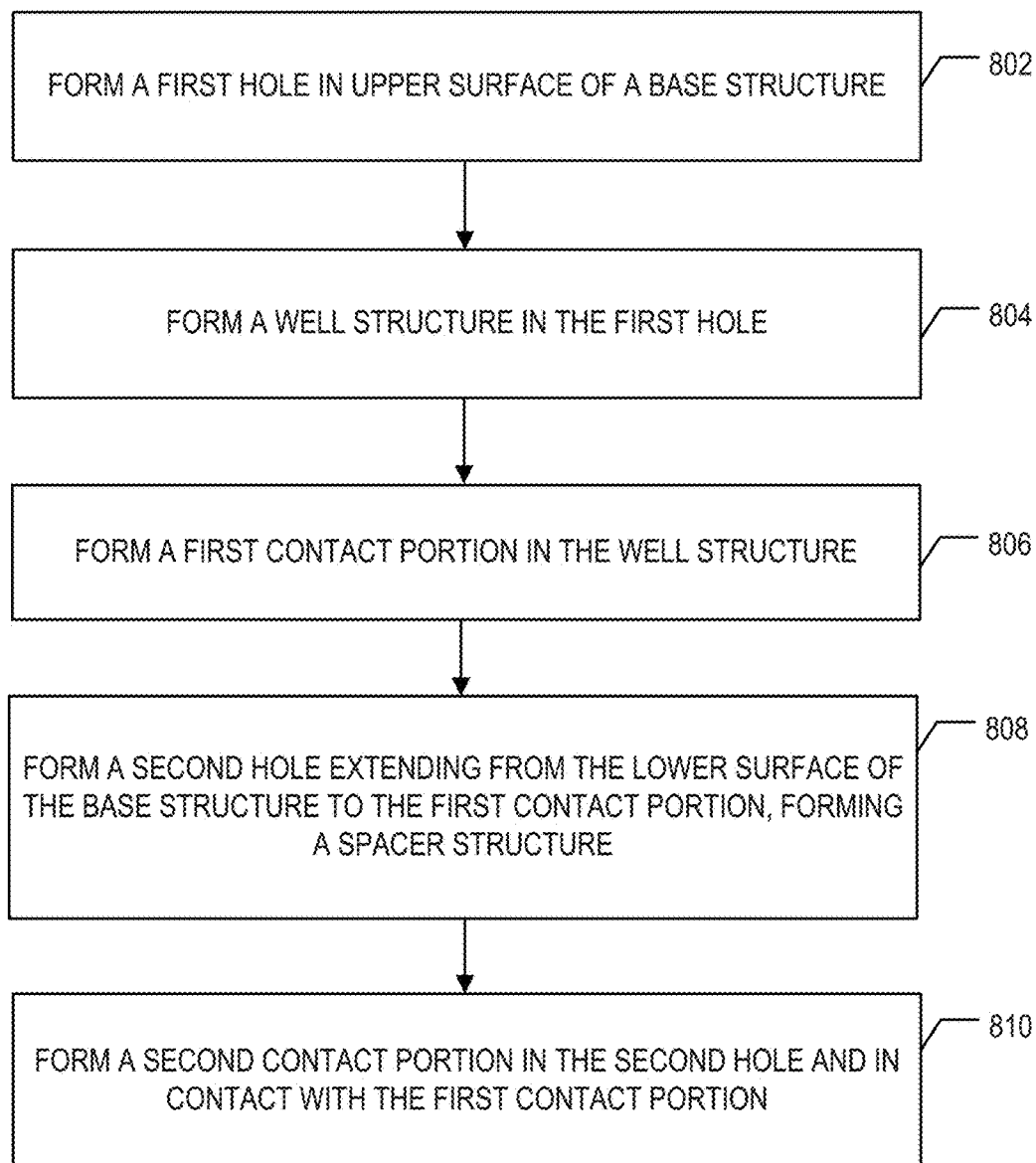
FIG. 8 illustrates a flowchart of an exemplary method for forming another contact structure, according to some embodiments of the present disclosure.

FIGS. 5A-5D illustrate a fabrication process for forming a semiconductor device, according to some embodiments of the present disclosure. FIG. 8 illustrates a flowchart of a method 800 for forming a semiconductor device, according to some embodiments of the present disclosure. Examples of the semiconductor device depicted in FIGS. 5A-5D and 8 include semiconductor device depicted in FIGS. 3A and 3B. FIGS. 5A-5D and 8 will be described together. It is understood that the operations shown in method 800 are not exhaustive and that other operations can be performed as well before, after, or between any of the illustrated operations. Further, some of the operations may be performed simultaneously, or in a different order than shown in FIG. 8. For ease of illustration, parts in FIGS. 5A-5D that are similar to those in FIGS. 4A-4D are depicted using the same numerals, and the detailed descriptions of these parts are not repeated herein.

Figure 5A:
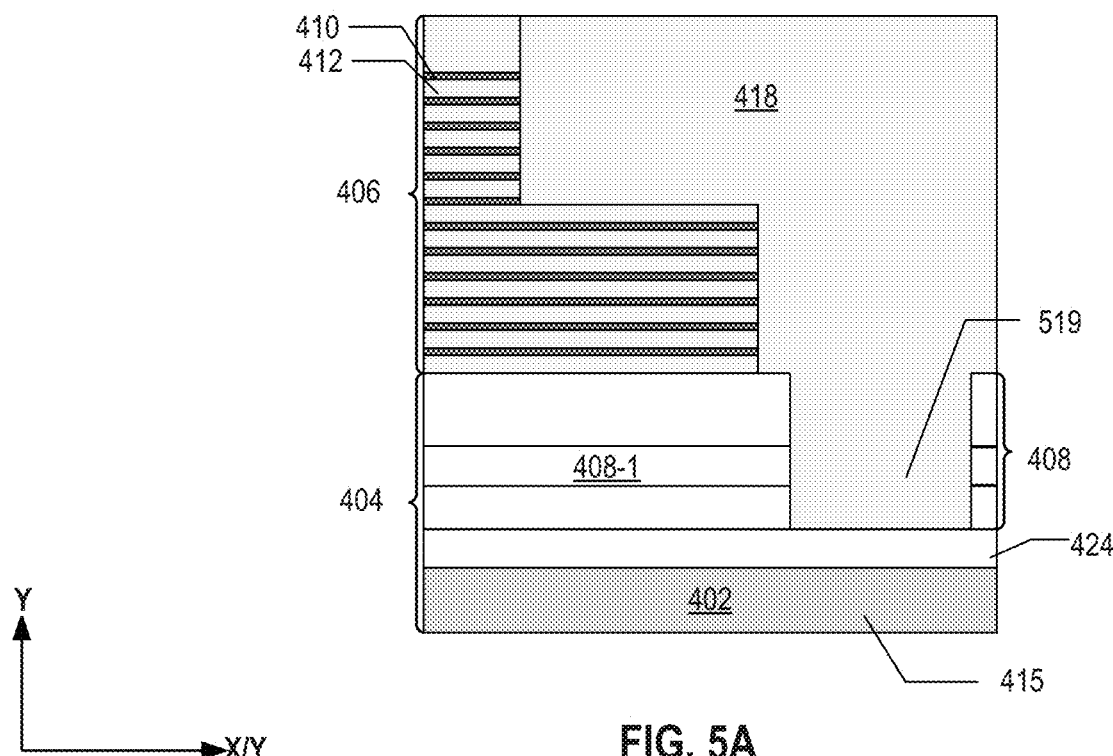
FIGS. 5A-5D illustrate an exemplary fabrication process for forming another contact structure, according to some embodiments of the present disclosure.

Referring to FIG. 8, method 800 starts at operations 802 and 804, in which a first hole is formed in a base structure, and a well structure is formed in the first hole. FIG. 5A illustrates a corresponding structure.

As shown in FIG. 5A, at the beginning of the fabrication process, a first hole may be formed in a base structure 404. The shapes and depth of first hole may correspond to those of the subsequently-formed spacer structure. In some embodiments, the lower surface of the first hole may expose stop layer 424. In some embodiments, the depth of the first hole may be higher than or equal to the thickness of polysilicon layer 408 such that the subsequently-formed spacer structure can insulate the contact structure from polysilicon layer 408. The first hole may be formed at any suitable time during a fabrication process, and can be formed with other structures or in a separate process. A suitable etching process, e.g., wet etch and/or dry etch, can be performed as the patterning process to form the first hole. The detailed description of the location and timing to form the first hole may be referred to that of the trench structure described in FIGS. 4A-4D, and is not repeated herein.

A well structure 519 may be formed in base structure 404 by filling the first hole with a dielectric material. The lower surface of well structure 519 may be in contact with the stop layer 424. In some embodiments, the lower surface of well structure 519 may be on or below the top surface of stop layer 424. The upper surface well structure 519 may be defined as the surface coplanar with the upper surface of polysilicon layer 408, for ease of illustration. In some embodiments, the dielectric material includes silicon oxide, and can be formed in a suitable film deposition method such as CVD, PVD, ALD, or a combination thereof. The detailed description of the location and timing to form well structure 519 may be referred to that of spacer structure 420 described in FIGS. 4A-4D, and is not repeated herein.

Figure 5B:
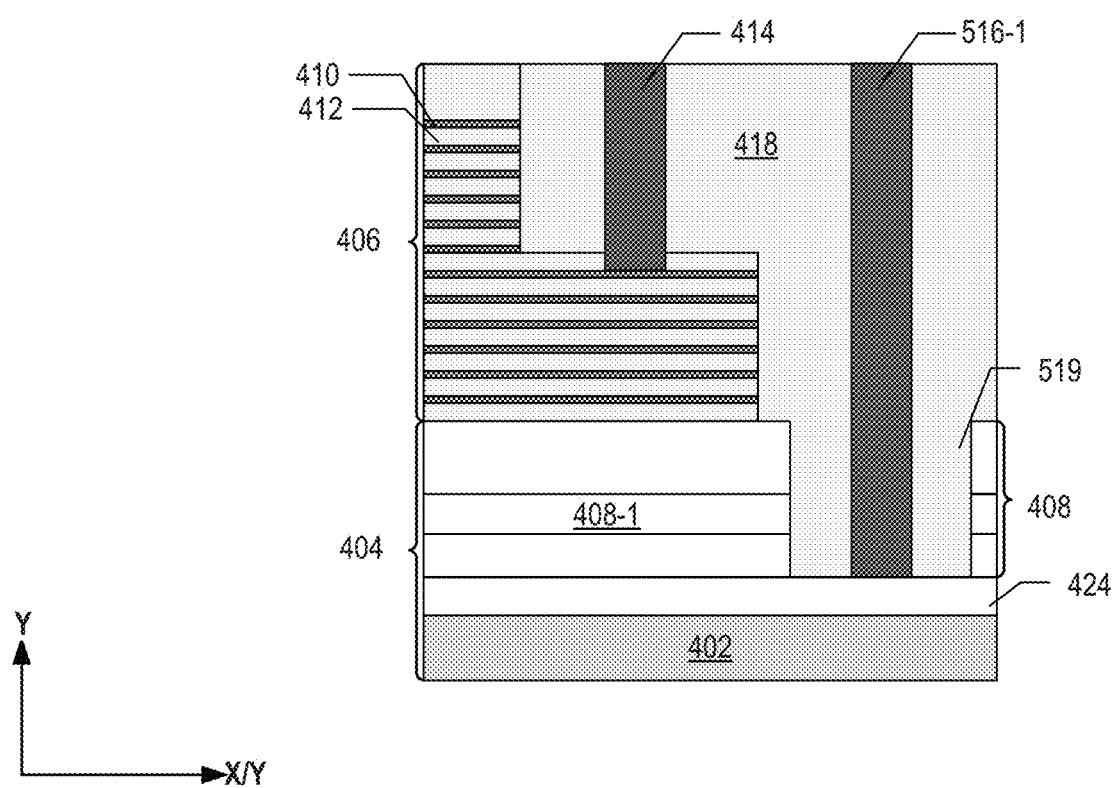

Referring back to FIG. 8, method 800 proceeds to operation 806, in which a first contact portion is formed in the well structure. FIG. 5B illustrates a corresponding structure.

As shown in FIG. 5B, a first contact portion 516-1 may be formed in well structure 519. First contact portion 516-1 may be formed in insulating structure 418 and landed on the lower surface of well structure 519. First contact portion 516-1 may be surrounded by well structure 519. In some embodiments, first contact portion 516-1 is formed by the same process that forms a word line contact 414, which lands on a respective stair to form a conductive connection with conductor layer 410 in the stair. First contact portion 516-1 and word line contact 414 may each include a suitable conductive material such as tungsten. In some embodiments, the lower surface of first contact portion 516-1 does not reach the lower surface of well structure 519 but is below the upper surface of polysilicon layer 408 such that the etching from the lower surface of base structure 404 can be reduced when the second contact portion is being formed. That is, the second hole to form the second contact portion does not need to reach the upper surface of polysilicon layer 408 from the lower surface of base structure 404, i.e., insulating layer 402.

The formation of first contact portion 516-1 and word line contact 414 may include a patterning process followed by a suitable film deposition process. The patterning process may remove portions of insulating structure 418 to form openings, at desired depths, that correspond to the locations and positions of first contact portion 516-1 and word line contact 414. In some embodiments, the opening for first contact portion 516-1 extends in insulating structure 418 and exposes the enclosed area in polysilicon layer 408. In some embodiments, the opening for word line contact 414 extends in insulating structure 418 and exposes conductor layer 410 in the corresponding stair. The deposition of the conductive material may include CVD, PVD, ALD, electroplating, electroless plating, and a combination thereof.

Figure 5C:
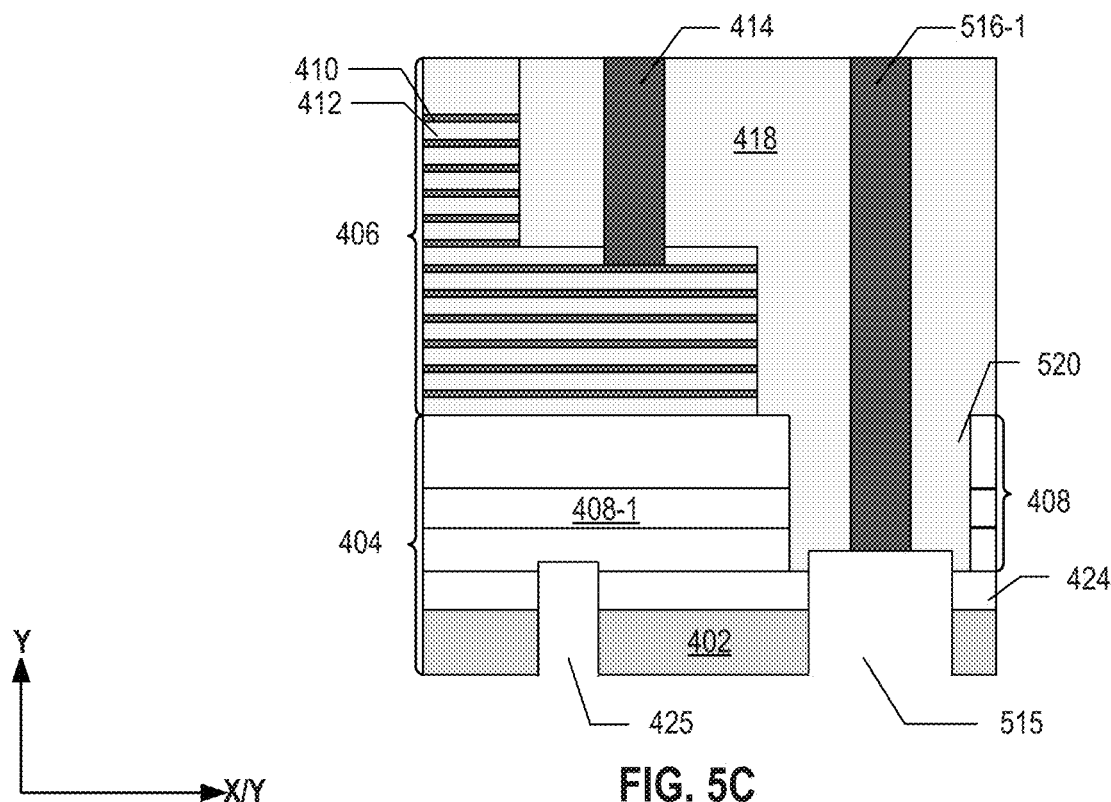

Referring back to FIG. 8, method 800 proceeds to operation 808, in which a second hole is formed extending from the lower surface of the base structure to the first contact portion. A spacer structure is formed. FIG. 5C illustrates a corresponding structure.

As shown in FIG. 5C, a second hole 515 may be formed extending from the lower surface of base structure 404 to first contact portion 516-1. A spacer structure 520 may be formed from the remaining portion of well structure 519. Second hole 515 may be surrounded by spacer structure 520 in polysilicon layer 408. A portion of base structure 404, i.e., a portion of insulating layer 402, stop layer 424, and polysilicon layer 408 (if any), may be removed to form second hole 515, which extends from the lower surface of base structure 404, e.g., the lower surface of insulating layer 402, to first contact portion 516-1. Second hole 515 may be in contact with and exposing first contact portion 516-1. In various embodiments, the upper surface of second hole 515 may be coplanar with or above the upper surface of stop layer 424 to ensure sufficient contact between first contact portion 516 and second hole 515 (or subsequently-formed second contact portion). As shown in FIG. 5C, the lateral dimensions of hole 415 may be sufficiently large to fully contact first contact portion 516-1, and may be sufficiently small to not exceed spacer structure 420. In some embodiments, second hole 515 is isolated from polysilicon layer 408 outside of spacer structure 520. In some embodiments, the lateral dimensions of second hole 515 may be less than or equal to the lateral dimensions of well structure 519 (or spacer structure 520). In some embodiments, another hole 425, for forming a source contact structure 426, may be formed in the same patterning process that forms hole 415. The patterning process may include a suitable etching process, e.g., dry etch and/or wet etch processes.

Figure 5D:
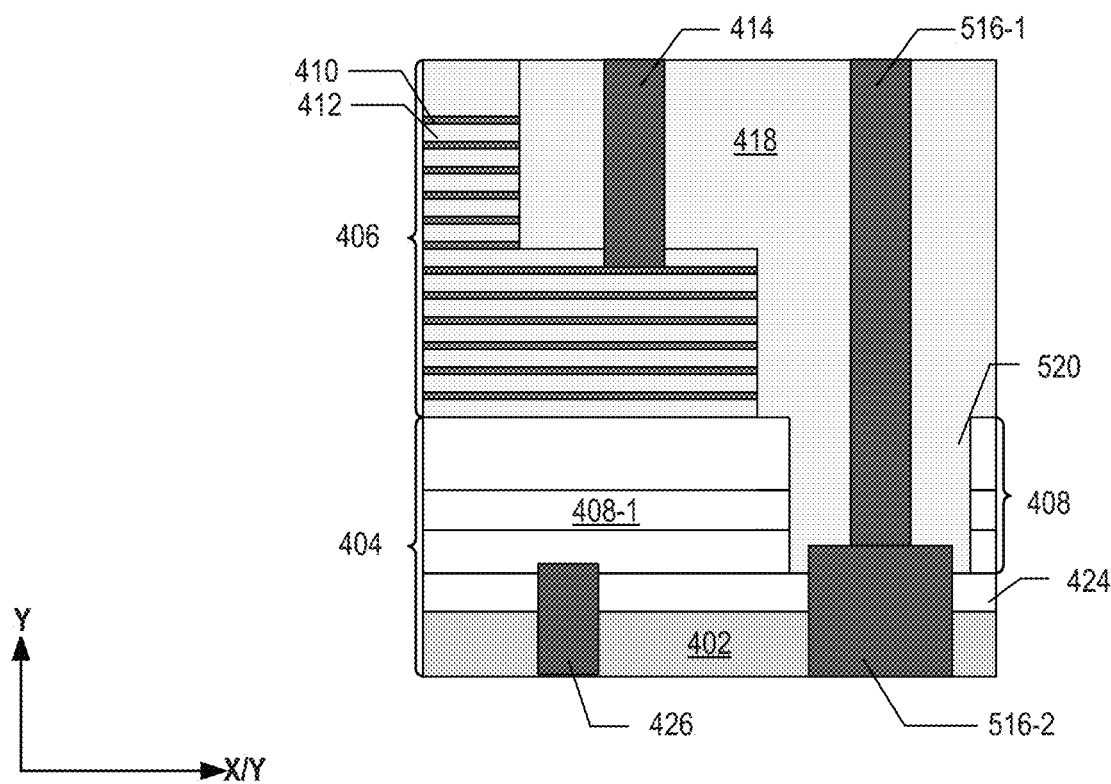

Referring back to FIG. 8, method 800 proceeds to operation 810, in which a second contact portion is formed in the second hole and in contact with the first contact portion. FIG. 5D illustrates a corresponding structure.

As shown in FIG. 5D, a second contact portion 516-2 may be formed in second hole 515, in contact with first contact portion 516-1. A conductive material, such as tungsten, can be deposited to fill in second hole 515 and the other hole 425. Any suitable film deposition method can be performed to deposit the conductive material. For example, the deposition method may include CVD, PVD, ALD, electroplating, electroless plating, or a combination thereof. In some embodiments, a source contact structure 426 may be formed by the same deposition process that forms second contact portion 516-2. A contact structure 516, having first and second contact portions 516-1 and 516-2 in contact with each other, may be formed extending insulating structure 418 and base structure 404 (e.g., spacer structure 520), connecting peripheral circuits of the semiconductor device. A lower surface of first conductor portion 516-1 may be below the upper surface of spacer structure 520. The upper surface of second conductor portion 516-2 may be a flat/leveled surface.

Embodiments of the present disclosure provide a semiconductor device. The semiconductor device includes an insulating layer, a conductive layer over the insulating layer, and a spacer structure in the conductive layer and in contact with the insulating layer. The semiconductor device also includes a first contact structure in the spacer structure and extending vertically through the insulating layer. The first contact structure includes a first contact portion and a second contact portion in contact with each other. An upper surface of the second contact portion is coplanar with an upper surface of the conductive layer.

In some embodiments, the conductive layer includes polysilicon.

In some embodiments, a lateral cross-sectional area of the second contact portion is greater than or equal to a lateral cross-sectional area of the first contact portion.

In some embodiments, the semiconductor device further includes a memory stack comprising interleaved conductive layers and dielectric layers over the conductive layer and apart from the contact structure. In some embodiments, the semiconductor device also includes a channel structure in the memory stack and into the conductive layer. The channel structure includes a semiconductor channel A lower portion of the semiconductor channel is in contact with the conductive layer. A second contact structure extends vertically in the insulating layer and is in contact with the conductive layer.

In some embodiments, the channel structure further includes a memory layer in contact with and surrounding the semiconductor channel. In some embodiments, a lower portion of the memory layer is disconnected to expose the semiconductor channel such that the semiconductor channel is in contact with the conductive layer.

In some embodiments, the spacer structure comprises a dielectric material.

In some embodiments, the first contact structure electrically connects a peripheral circuit and a contact pad on opposite sides of the insulating and conductive layers.

In some embodiments, the first contact structure is electrically connected to the second contact structure.

Embodiments of the present disclosure provide a semiconductor device. The semiconductor device includes an insulating layer, a conductive layer over the insulating layer, and a spacer structure in the conductive layer and in contact with the insulating layer. The semiconductor device also includes a first contact structure in the spacer structure and extending vertically through the insulating layer. The first contact structure includes a first contact portion and a second contact portion in contact with each other. The contact structure also includes a lower surface of the first contact portion is in contact with an upper surface of the second contact portion at a contact interface that is below an upper surface of the conductive layer.

In some embodiments, the contact interface is coplanar with a lower surface of the conductive layer.

In some embodiments, the conductive layer includes polysilicon.

In some embodiments, a lateral cross-sectional area of the second contact portion is greater than or equal to a lateral cross-sectional area of the first contact portion.

In some embodiments, the semiconductor device further includes a memory stack comprising interleaved conductive layers and dielectric layers over the conductive layer and apart from the contact structure, and a channel structure in the memory stack and into the conductive layer. The channel structure includes a semiconductor channel. A lower portion of the semiconductor channel is in contact with the conductive layer. A second contact structure extends vertically in the insulating layer and is in contact with the conductive layer.

In some embodiments, the channel structure further includes a memory layer in contact with and surrounding the semiconductor channel. In some embodiments, a lower portion of the memory layer is disconnected to expose the semiconductor channel such that the semiconductor channel is in contact with the conductive layer.

In some embodiments, the spacer structure comprises a dielectric material.

In some embodiments, the first contact structure electrically connects a peripheral circuit and a contact pad on opposite sides of the insulating and conductive layers.

In some embodiments, the first contact structure is electrically connected to the second contact structure.

Embodiments of the present disclosure provide a method for forming a semiconductor device. The method includes forming a spacer structure from a first surface of the base structure into the base structure, forming a first contact portion surrounded by the spacer structure, and forming a second contact portion in contact with the first contact portion. The second contact extends from a second surface of the base structure into the base structure.

In some embodiments, forming the spacer structure includes removing a portion of the base structure on the first surface to form an opening structure extending from the first surface into the base structure. In some embodiments, forming the spacer structure includes filling the opening structure with an insulating material.

In some embodiments, a lower surface of the opening structure is between the first and second surfaces of the base structure.

In some embodiments, the base structure includes an insulating layer and a conductive layer over the insulating layer. In some embodiments, forming the opening structure includes forming a trench structure in the conductive layer to form a first portion of the conductive layer enclosed by the trench structure and a second portion of the conductive layer outside the trench structure.

In some embodiments, the first portion of the conductive layer is isolated from the second portion of the conductive layer by the trench structure, and a lower surface of the trench structure is in contact with the insulating layer.

In some embodiments, forming the first contact portion surrounded by the spacer structure includes forming the first contact portion in contact with the first portion of the conductive layer and surrounded by the insulating material.

In some embodiments, forming the second contact portion includes forming a hole extending from the second surface of the base structure into the base structure and in contact with the first contact portion. The hole is insulated from the second portion of the conductive layer by the spacer structure. In some embodiments, forming the second contact portion includes filling the hole with a conductive material.

In some embodiments, the base structure includes an insulating layer and a conductive layer over the insulating layer. In some embodiments, forming the opening structure includes forming a hole in the conductive layer, a lower surface of the hole in contact with the insulating layer.

In some embodiments, forming the first contact portion surrounded by the spacer structure includes forming the first contact portion extending in the insulating material. A lower surface of the first contact portion is below an upper surface of the spacer structure.

In some embodiments, the lower surface of the first contact portion is in contact with the insulating layer.

In some embodiments, forming the second contact portion includes forming another hole extending from the second surface of the base structure into the base structure and in contact with the first contact portion. The hole is insulated from the conductive layer by the insulating material. In some embodiments, forming the second contact portion includes filling the hole with a conductive material.

In some embodiments, the base structure includes an insulating layer, an etch-stop layer over the insulating layer, and a conductive layer over the etch-stop layer. In some embodiments, forming the opening structure includes removing a portion of the conductive layer until a lower surface of the opening structure stops on the etch-stop layer.

In some embodiments, the method further includes forming a memory stack on the base structure away from the contact structure. The insulating material is deposited before a formation of the memory stack.

In some embodiments, the method further includes forming a memory stack on the base structure away from the contact structure. The insulating material is deposited after a formation of the memory stack.

In some embodiments, the method further includes forming a channel structure comprising a semiconductor channel in the memory stack. A lower portion of the semiconductor channel is in contact with the conductive layer. In some embodiments, forming a contact structure extending from the second surface of the base structure into the base structure and in contact with the conductive layer. The contact structure is formed in the same process that forms the second contact portion.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a semiconductor device, comprising:
    forming a spacer structure from a first surface of a base structure into the base structure, wherein the base structure comprises an insulating layer and a conductive layer over the insulating layer;
    forming a memory stack on the base structure, comprising:
        forming a channel structure comprising a semiconductor channel in the memory stack, a lower portion of the semiconductor channel being in contact with the conductive layer;
    forming a first contact portion surrounded by the spacer structure; and
    forming a second contact portion in contact with the first contact portion, the second contact portion extending from a second surface of the base structure into the base structure,
    wherein a lateral cross-sectional area of the second contact portion is greater than a lateral cross-sectional area of the first contact portion.

2. The method of claim 1, wherein forming the spacer structure comprises:
    removing a portion of the base structure on the first surface to form an opening structure extending from the first surface into the base structure; and
    filling the opening structure with an insulating material.

3. The method of claim 2, wherein a lower surface of the opening structure is between the first and second surfaces of the base structure.

4. The method of claim 2, wherein forming the opening structure comprises forming a trench structure in the conductive layer to form a first portion of the conductive layer enclosed by the trench structure and a second portion of the conductive layer outside the trench structure.

5. The method of claim 4, wherein
    the first portion of the conductive layer is isolated from the second portion of the conductive layer by the trench structure, and
    a lower surface of the trench structure is in contact with the insulating layer.

6. The method of claim 4, wherein forming the first contact portion surrounded by the spacer structure comprises:
    forming the first contact portion in contact with the first portion of the conductive layer and surrounded by the insulating material.

7. The method of claim 4, wherein forming the second contact portion comprises:
    forming a hole extending from the second surface of the base structure into the base structure and in contact with the first contact portion, the hole being insulated from the second portion of the conductive layer by the spacer structure; and
    filling the hole with a conductive material.

8. The method of claim 2, wherein forming the opening structure comprises:

forming a hole in the conductive layer, a lower surface of the hole in contact with the insulating layer.

9. The method of claim 8, wherein forming the first contact portion surrounded by the spacer structure comprises:
forming the first contact portion extending in the insulating material, a lower surface of the first contact portion being below an upper surface of the spacer structure.

10. The method of claim 9, wherein the lower surface of the first contact portion is in contact with the insulating layer.

11. The method of claim 7, wherein forming the second contact portion comprises:
forming another hole extending from the second surface of the base structure into the base structure and in contact with the first contact portion, the another hole being insulated from the conductive layer by the insulating material; and
filling the another hole with a conductive material.

12. The method of claim 2, wherein
the base structure comprises the insulating layer, an etch-stop layer over the insulating layer, and the conductive layer over the etch-stop layer; and
forming the opening structure comprises removing a portion of the conductive layer until a lower surface of the opening structure stops on the etch-stop layer.

13. The method of claim 2, wherein the insulating material is deposited before a formation of the memory stack.

14. The method of claim 2, wherein the insulating material is deposited after a formation of the memory stack.

15. The method of claim 13, further comprising:
forming a contact structure extending from the second surface of the base structure into the base structure and in contact with the conductive layer.

16. A method for forming a semiconductor device, comprising:
forming a spacer structure from a first side of a base structure into the base structure, wherein the base structure comprises an insulating layer and a conductive layer over the insulating layer;
forming a memory stack on the base structure, comprising:
forming a channel structure comprising a semiconductor channel in the memory stack, a lower portion of the semiconductor channel being in contact with the conductive layer;
forming a first contact portion from the first side of the base structure, wherein the first contact portion is surrounded by the spacer structure; and
forming a second contact portion from a second side of the base structure in contact with the first contact portion, wherein the second side is opposite to the first side of the base structure,
wherein a lateral cross-sectional area of the second contact portion is greater than a lateral cross-sectional area of the first contact portion.

17. The method of claim 16, wherein forming the memory stack on the base structure, comprises:
forming the memory stack on the first side of the base structure.

* * * * *